United States Patent
Lee et al.

(10) Patent No.: US 10,957,392 B2
(45) Date of Patent: Mar. 23, 2021

(54) 2D AND 3D SUM-OF-PRODUCTS ARRAY FOR NEUROMORPHIC COMPUTING SYSTEM

(71) Applicant: MACRONIX INTERNATIONAL CO., LTD., Hsinchu (TW)

(72) Inventors: Feng-Min Lee, Hsinchu (TW); Yu-Yu Lin, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/233,404

(22) Filed: Dec. 27, 2018

(65) Prior Publication Data

US 2019/0221263 A1    Jul. 18, 2019

Related U.S. Application Data

(63) Continuation-in-part of application No. 15/887,166, filed on Feb. 2, 2018, now abandoned, and a
(Continued)

(51) Int. Cl.
    *G11C 16/04*      (2006.01)
    *G11C 16/08*      (2006.01)
    (Continued)

(52) U.S. Cl.
    CPC .......... *G11C 16/0483* (2013.01); *G06F 7/388* (2013.01); *G06F 7/5443* (2013.01);
    (Continued)

(58) Field of Classification Search
None
See application file for complete search history.

(56) References Cited

U.S. PATENT DOCUMENTS

| 4,219,829 A | 8/1980 | Dorda et al. |
| 4,987,090 A | 1/1991 | Hsu et al. |

(Continued)

FOREIGN PATENT DOCUMENTS

| CN | 1998012 B | 11/2010 |
| CN | 105718994 A | 6/2016 |

(Continued)

OTHER PUBLICATIONS

EP Extended Search Report from 18155279.5-1203 dated Aug. 30, 2018, 8 pages.
(Continued)

*Primary Examiner* — J. H. Hur
(74) *Attorney, Agent, or Firm* — Haynes Beffel & Wolfeld LLP

(57) ABSTRACT

An array of variable resistance cells based on a programmable threshold transistor and a resistor connected in parallel is described, including 3D and split gate variations. An input voltage applied to the transistor, and the programmable threshold of the transistor, can represent variables of sum-of-products operations. Programmable threshold transistors in the variable resistance cells comprise charge trapping memory transistors, such as floating gate transistors or dielectric charge trapping transistors. The resistor in the variable resistance cells can comprise a buried implant resistor connecting the current-carrying terminals (e.g. source and drain) of the programmable threshold transistor. A voltage sensing sense amplifier is configured to sense the voltage generated by the variable resistance cells as a function of an applied current and the resistance of the variable resistance cells.

13 Claims, 20 Drawing Sheets

Related U.S. Application Data continuation-in-part of application No. 15/873,369, filed on Jan. 17, 2018, now Pat. No. 10,719,296.

(60) Provisional application No. 62/753,726, filed on Oct. 31, 2018.

(51) Int. Cl.

| | |
|---|---|
| *H01L 29/792* | (2006.01) |
| *H01L 29/788* | (2006.01) |
| *G11C 16/26* | (2006.01) |
| *G06N 3/063* | (2006.01) |
| *G06F 7/544* | (2006.01) |
| *G11C 16/10* | (2006.01) |
| *G11C 11/54* | (2006.01) |
| *G06F 7/38* | (2006.01) |
| *H01L 27/1157* | (2017.01) |
| *H01L 27/11556* | (2017.01) |
| *H01L 27/11582* | (2017.01) |
| *H01L 27/11524* | (2017.01) |

(52) U.S. Cl.
CPC ............ *G06N 3/0635* (2013.01); *G11C 11/54* (2013.01); *G11C 16/08* (2013.01); *G11C 16/10* (2013.01); *G11C 16/26* (2013.01); *H01L 29/7881* (2013.01); *H01L 29/792* (2013.01); *G06F 2207/4802* (2013.01); *H01L 27/1157* (2013.01); *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 5,029,130 A | 7/1991 | Yeh | |
| 5,586,073 A | 12/1996 | Hiura et al. | |
| 6,107,882 A | 8/2000 | Gabara et al. | |
| 6,313,486 B1 | 11/2001 | Kencke et al. | |
| 6,829,598 B2 | 12/2004 | Milev | |
| 6,906,940 B1 | 6/2005 | Lue | |
| 6,960,499 B2 | 11/2005 | Nandakumar et al. | |
| 7,089,218 B1 | 8/2006 | Visel | |
| 7,368,358 B2 | 5/2008 | Ouyang et al. | |
| 7,436,723 B2 | 10/2008 | Rinerson et al. | |
| 7,747,668 B2 | 6/2010 | Nomura et al. | |
| 8,203,187 B2 | 6/2012 | Lung et al. | |
| 8,275,728 B2 | 9/2012 | Pino | |
| 8,432,719 B2 | 4/2013 | Lue | |
| 8,589,320 B2 | 11/2013 | Breitwisch et al. | |
| 8,630,114 B2 | 1/2014 | Lue | |
| 8,725,670 B2 | 5/2014 | Visel | |
| 8,860,124 B2 | 10/2014 | Lue et al. | |
| 9,064,903 B2 | 6/2015 | Mitchell et al. | |
| 9,147,468 B1 | 9/2015 | Lue | |
| 9,213,936 B2 | 12/2015 | Visel | |
| 9,379,129 B1 | 6/2016 | Lue et al. | |
| 9,391,084 B2 | 7/2016 | Lue | |
| 9,430,735 B1 | 8/2016 | Vali et al. | |
| 9,431,099 B2 | 8/2016 | Lee et al. | |
| 9,524,980 B2 | 12/2016 | Lue | |
| 9,535,831 B2 | 1/2017 | Jayasena et al. | |
| 9,536,969 B2 | 1/2017 | Yang et al. | |
| 9,589,982 B1 | 3/2017 | Cheng et al. | |
| 9,698,156 B2 | 7/2017 | Lue | |
| 9,698,185 B2 | 7/2017 | Chen et al. | |
| 9,710,747 B2 | 7/2017 | Kang et al. | |
| 9,747,230 B2 | 8/2017 | Han et al. | |
| 9,754,953 B2 | 9/2017 | Tang et al. | |
| 9,767,028 B2 | 9/2017 | Cheng et al. | |
| 9,898,207 B2 | 2/2018 | Kim et al. | |
| 9,910,605 B2 | 3/2018 | Jayasena et al. | |
| 9,978,454 B2 | 5/2018 | Jung | |
| 9,983,829 B2 | 5/2018 | Ravimohan et al. | |
| 9,991,007 B2 | 6/2018 | Lee et al. | |
| 10,037,167 B2 | 7/2018 | Kwon et al. | |
| 10,056,149 B2 | 8/2018 | Yamada et al. | |
| 10,073,733 B1 | 9/2018 | Jain et al. | |
| 10,153,348 B1* | 12/2018 | Bhattacharyya | ............................ H01L 29/42324 |
| 10,157,012 B2 | 12/2018 | Kelner et al. | |
| 10,175,667 B2 | 1/2019 | Bang et al. | |
| 10,242,737 B1 | 3/2019 | Lin et al. | |
| 10,374,101 B2* | 8/2019 | Bhattacharyya | .... H01L 27/1157 |
| 10,528,643 B1 | 1/2020 | Choi et al. | |
| 10,534,840 B1 | 1/2020 | Petti | |
| 10,643,713 B1 | 5/2020 | Louie et al. | |
| 2003/0122181 A1 | 7/2003 | Wu | |
| 2005/0287793 A1 | 12/2005 | Blanchet et al. | |
| 2010/0182828 A1 | 7/2010 | Shima et al. | |
| 2010/0202208 A1 | 8/2010 | Endo et al. | |
| 2011/0063915 A1 | 3/2011 | Tanaka et al. | |
| 2011/0106742 A1 | 5/2011 | Pino | |
| 2011/0128791 A1 | 6/2011 | Chang et al. | |
| 2011/0286258 A1 | 11/2011 | Chen et al. | |
| 2011/0297912 A1 | 12/2011 | Samachisa et al. | |
| 2012/0007167 A1 | 1/2012 | Hung et al. | |
| 2012/0044742 A1 | 2/2012 | Narayanan | |
| 2012/0182801 A1 | 7/2012 | Lue | |
| 2012/0235111 A1 | 9/2012 | Osano et al. | |
| 2012/0254087 A1 | 10/2012 | Visel | |
| 2013/0070528 A1 | 3/2013 | Maeda | |
| 2013/0075684 A1 | 3/2013 | Kinoshita et al. | |
| 2014/0063949 A1 | 3/2014 | Tokiwa | |
| 2014/0119127 A1 | 5/2014 | Lung et al. | |
| 2014/0149773 A1 | 5/2014 | Huang et al. | |
| 2014/0268996 A1 | 9/2014 | Park | |
| 2014/0330762 A1 | 11/2014 | Visel | |
| 2015/0008500 A1 | 1/2015 | Fukumoto et al. | |
| 2015/0171106 A1* | 6/2015 | Suh | ..................... H01L 27/1157 257/324 |
| 2015/0199126 A1 | 7/2015 | Jayasena et al. | |
| 2015/0331817 A1 | 11/2015 | Han et al. | |
| 2016/0141337 A1 | 5/2016 | Shimabukuro et al. | |
| 2016/0181315 A1 | 6/2016 | Lee et al. | |
| 2016/0232973 A1 | 8/2016 | Jung | |
| 2016/0247579 A1 | 8/2016 | Ueda et al. | |
| 2016/0308114 A1 | 10/2016 | Kim et al. | |
| 2016/0336064 A1 | 11/2016 | Seo et al. | |
| 2016/0358661 A1 | 12/2016 | Vali et al. | |
| 2017/0003896 A1 | 1/2017 | Kim et al. | |
| 2017/0025421 A1* | 1/2017 | Sakakibara | ........ H01L 29/40117 |
| 2017/0092370 A1 | 3/2017 | Harari | |
| 2017/0123987 A1 | 5/2017 | Cheng et al. | |
| 2017/0148517 A1 | 5/2017 | Harari | |
| 2017/0160955 A1 | 6/2017 | Jayasena et al. | |
| 2017/0169885 A1 | 6/2017 | Tang et al. | |
| 2017/0169887 A1 | 6/2017 | Widjaja | |
| 2017/0263623 A1* | 9/2017 | Zhang | ................... H01L 23/528 |
| 2017/0270405 A1 | 9/2017 | Kurokawa | |
| 2017/0309634 A1 | 10/2017 | Noguchi et al. | |
| 2017/0316833 A1 | 11/2017 | Ihm et al. | |
| 2017/0317096 A1 | 11/2017 | Shin et al. | |
| 2017/0337466 A1 | 11/2017 | Bayat et al. | |
| 2018/0121790 A1 | 5/2018 | Kim et al. | |
| 2018/0129424 A1 | 5/2018 | Confalonieri et al. | |
| 2018/0157488 A1 | 6/2018 | Shu et al. | |
| 2018/0173420 A1 | 6/2018 | Li et al. | |
| 2018/0240522 A1 | 8/2018 | Jung | |
| 2018/0246783 A1 | 8/2018 | Avraham et al. | |
| 2018/0286874 A1* | 10/2018 | Kim | ................. H01L 21/02587 |
| 2018/0342299 A1 | 11/2018 | Yamada et al. | |
| 2019/0035449 A1 | 1/2019 | Saida et al. | |
| 2019/0043560 A1 | 2/2019 | Sumbul et al. | |
| 2019/0065151 A1 | 2/2019 | Chen et al. | |
| 2019/0102170 A1 | 4/2019 | Chen et al. | |
| 2019/0148393 A1 | 5/2019 | Lue | |
| 2019/0213234 A1 | 7/2019 | Bayat et al. | |
| 2019/0220249 A1* | 7/2019 | Lee | ................... G11C 16/0483 |
| 2019/0244662 A1* | 8/2019 | Lee | ................... H01L 27/1157 |
| 2019/0286419 A1 | 9/2019 | Lin et al. | |
| 2020/0026993 A1 | 1/2020 | Otsuka | |

(56) References Cited

U.S. PATENT DOCUMENTS

| | | |
|---|---|---|
| 2020/0065650 A1 | 2/2020 | Tran et al. |
| 2020/0110990 A1 | 4/2020 | Harada et al. |
| 2020/0160165 A1 | 5/2020 | Sarin |

FOREIGN PATENT DOCUMENTS

| | | |
|---|---|---|
| CN | 105789139 A | 7/2016 |
| CN | 106530210 A | 3/2017 |
| EP | 2048709 A2 | 4/2009 |
| TW | 201523838 A | 6/2015 |
| TW | 201618284 A | 5/2016 |
| TW | 201639206 A | 11/2016 |
| TW | 201732824 A | 9/2017 |
| TW | 201741943 A | 12/2017 |
| TW | 201802800 A | 1/2018 |
| TW | 201822203 A | 6/2018 |
| WO | 2012009179 A1 | 1/2012 |
| WO | 2012015450 A1 | 2/2012 |
| WO | 2016060617 A1 | 4/2016 |
| WO | 2017091338 A1 | 6/2017 |
| WO | 2018201060 A1 | 11/2018 |

OTHER PUBLICATIONS

EP Extended Search Report from EP18158099.4 dated Sep. 19, 2018, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent).

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Office Action in U.S. Appl. No. 15/887,166 dated Jan. 30, 2019, 18 pages.

U.S. Appl. No. 15/873,369, filed Jan. 17, 2018, entitled "Sum-of-Products Accelerator Array," Lee et al., 52 pages.

U.S. Appl. No. 15/887,166, filed Feb. 2, 2018, entitled "Sum-of-Products Array for Neuromorphic Computing System," Lee et al., 49 pages.

U.S. Appl. No. 15/895,369, filed Feb. 13, 2018, entitled "Device Structure for Neuromorphic Computing System," Lin et al., 34 pages.

U.S. Appl. No. 15/922,359, filed Mar. 15, 2018, entitled "Voltage Sensing Type of Matrix Multiplication Method for Neuromorphic Computing System," Lin et al., 40 pages.

U.S. Appl. No. 16/037,281, filed Jul. 17, 2018, 87 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

U.S. Office Action in related U.S. Appl. No. 15/873,369 dated May 9, 2019, 8 pages.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

U.S. Office Action in U.S. Appl. No. 15/922,359 dated Jun. 24, 2019, 8 pages.

Chen et al., "Eyeriss: An Energy-Efficient reconfigurable accelerator for deep convolutional neural networks," IEEE ISSCC, Jan. 31-Feb. 4, 2016, 3 pages.

EP Extended Search Report from EP19193290.4 dated Feb. 14, 2020, 10 pages.

Gonugondla et al., "Energy-Efficient Deep In-memory Architecture for NAND Flash Memories," IEEE International Symposium on Circuits and Systems (ISCAS), May 27-30, 2018, 5 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

U.S. Office Action in related U.S. Appl. No. 16/297,504 dated Feb. 4, 2020, 15 pages.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

TW Office Action from TW Application No. 10820980430, dated Oct. 16, 2019, 6 pages (with English Translation).

U.S. Office Action in U.S. Appl. No. 15/873,369 dated Dec. 4, 2019, 5 pages.

U.S. Office Action in U.S. Appl. No. 15/887,166 dated Jul. 10, 2019, 18 pages.

U.S. Office Action in U.S. Appl. No. 15/922,359 dated Oct. 11, 2019, 7 pages.

U.S. Office Action in related U.S. Appl. No. 16/037,281 dated Dec. 19, 2019, 9 pages.

Anonymous, "Data in the Computer", May 11, 2015, pp. 1-8, https://web.archive.org/web/20150511143158/https:// homepage.cs.uri.edu/faculty/wolfe/book/Readings/Reading02.htm (Year: 2015)—See Office Action dated Aug. 17, 2020 in U.S. Appl. No. 16/279,494 for relevance.

Rod Nussbaumer, "How is data transmitted through wires in the computer?", Aug. 27, 2015, pp. 1-3, https://www.quora.com/How-is-data-transmitted-through-wires-in-the-computer (Year: 2015)—See Office Action dated Aug. 17, 2020 in U.S. Appl. No. 16/279,494 for relevance.

Scott Thornton, "What is DRAm (Dynamic Random Access Memory) vs SRAM?", Jun. 22, 2017, pp. 1-11, https://www.microcontrollertips.com/dram-vs-sram/(Year: 2017)—See Office Action dated Aug. 17, 2020 in U.S. Appl. No. 16/279,494 for relevance.

TW Office Action from TW Application No. 10920683760, dated Jul. 20, 2020, 4 pages.

U.S. Office Action in U.S. Appl. No. 16/279,494 dated Aug. 17, 2020, 25 pages.

Webopedia, "DRAM—dynamic random access memory", Jan. 21, 2017, pp. 1-3, https://web.archive.org/web/20170121124008/https://www.webopedia.com/TERM/D/DRAM.html (Year: 2017)—See Office Action dated Aug. 17, 2020 in U.S. Appl. No. 16/279,494 for relevance.

Webopedia, "volatile memory", Oct. 9, 2017, pp. 1-4, https://web.archive.org/web/20171009201852/https://www.webopedia.com/TERMN/volatile_memory.html (Year: 2017)—See Office Action dated Aug. 17, 2020 in U.S. Appl. No. 16/279,494 for relevance.

Chen et al., "A Highly Pitch Scalable 3D Vertical Gate (VG) NAND Flash Decoded by a Novel Self-Aligned Independently Controlled

(56) References Cited

OTHER PUBLICATIONS

Double Gate (IDG) StringSelect Transistor (SSL)," 2012 Symp. on VLSI Technology (VLSIT), Jun. 12-14, 2012, pp. 91-92.

Choi et al., "Performance Breakthrough in NOR Flash Memory With Dopant-Segregated Schottky-Barrier (DSSB) SONOS Devices," Jun. 2009 Symposium on VLSITechnology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

TW Office Action from TW Application No. 10820907820, dated Sep. 22, 2020, 41 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

Y.X. Liu et al., "Comparative Study of Tri-Gate and Double-Gate-Type Poly-Si Fin-Channel Spli-Gate Flash Memories," 2012 IEEE Silicon Nanoelectronics Workshop (SNW), Honolulu, HI, Jun. 10-11, 2012, pp. 1-2.

\* cited by examiner

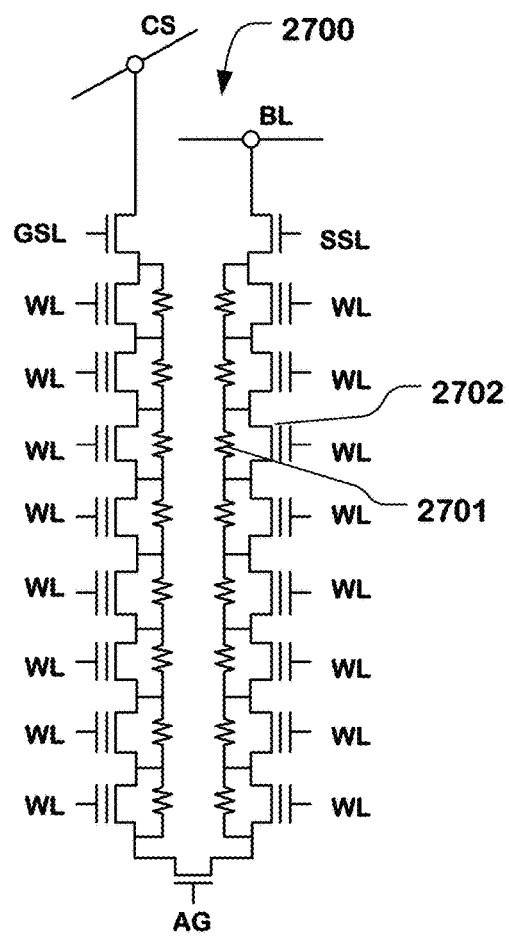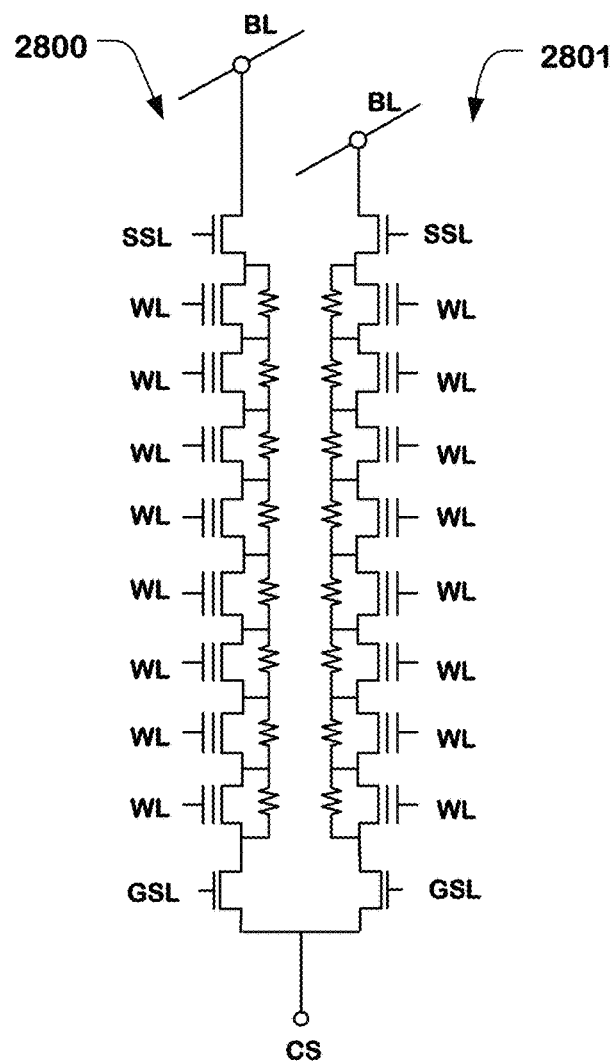
FIG. 27
FIG. 28

2D AND 3D SUM-OF-PRODUCTS ARRAY FOR NEUROMORPHIC COMPUTING SYSTEM

PRIORITY APPLICATION

This application is a continuation-in-part of U.S. patent application Ser. No. 15/873,369, filed on 17 Jan. 2018 (now U.S. Pat. No. 10,719,296); and is a continuation-in-part of U.S. patent application Ser. No. 15/887,166, filed on 2 Feb. 2018 (now abandoned); and also claims the benefit of U.S. Provisional Patent Application No. 62/753,726 filed 31 Oct. 2018; which applications are incorporated herein by reference.

BACKGROUND

Field

The present invention relates to circuitry that can be used to perform or support sum-of-products operations.

Description of Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function.

For high-speed implementations, it is desirable to have a very large array so that many operations can be executed in parallel, or very large sum-of-products series can be performed. In the systems, there can be a very large number of inputs and outputs, so that the total current consumption can be very large.

It is desirable to provide structures for sum-of-products functions suitable for implementation in large arrays, and that can be more energy-efficient.

SUMMARY

A device is described that comprises an array of variable resistance cells, where a variable resistance cell in the array comprises a programmable threshold transistor and a resistor connected in parallel. The device can be operated so that an input voltage applied to the transistor and the programmable threshold of the transistor can represent variables of sum-of-products operations. The variable resistance of each variable resistance cell, in embodiments described herein, is a function of a voltage applied to the control gate of the programmable threshold transistor in the cell, a threshold of the programmable threshold transistor, and the resistor.

The device in some embodiments includes a voltage sensing sense amplifier, configured to sense the voltage generated by the variable resistance cells, as a function of an applied current and the resistance of the variable resistance cells. In this manner, the magnitude of the current generated to produce the sum-of-products result can be limited or fixed, reducing the power consumption.

The array can be implemented in 2D and 3D arrays, using cells consisting of one transistor and one resistor (1T-1R). Furthermore, embodiments described herein can implement the resistor as a buried implant resistor within the layout footprint of a single variable threshold transistor, in effect making an array of one transistor (1T) cells, for a very compact layout configured for sum-of-products operations with voltage sensing.

Embodiments are described in which variable resistance cells in the array are configured in a plurality of strings of series-connected variable resistance cells. A plurality of word lines can be coupled to the strings of series-connected variable resistance cells. Word line drivers are connected to the plurality of word lines to apply variable gate voltages to the programmable threshold transistors in the variable resistance cells.

Embodiments are described in which the programmable threshold transistors in the variable resistance cells comprise charge trapping memory transistors, such as floating gate transistors or dielectric charge trapping transistors.

Embodiments are described in which the resistors in the variable resistance cells comprise a buried implant resistor connecting the current-carrying terminals (e.g. source and drain) of the programmable threshold transistor.

A device for generating sum-of-products data is provided that includes an array of variable resistance cells, variable resistance cells in the array each comprising a programmable threshold transistor and a resistor connected in parallel, the array including n columns of cells including strings of series connected cells and m rows of cells. Control and bias circuitry are coupled to the array, including logic for programming the programmable threshold transistors in the array with thresholds corresponding to values of a weight factor $W_{mn}$ for the corresponding cell. Input drivers are coupled to corresponding ones of the m rows of cells, the input drivers selectively applying inputs $X_m$ to rows m. Column drivers are configured to apply currents $I_n$ to corresponding ones of the n columns of cells. Voltage sensing circuits operatively coupled to the columns of cells.

A system including a memory array and a sum-of-products accelerator array interconnected using a data path controller is described. The sum-of-products accelerator array comprises an array of programmable resistance cells. The memory array can be used in coordination with the sum-of-products accelerator array for configuration and operation of the sum-of-products functions.

A method for operating an array of variable resistance cells to produce sum of products data comprises programming the programmable threshold transistors in the array with thresholds corresponding to values of a weight factor for the corresponding cell; selectively applying inputs to rows of cells in the array applying currents to corresponding ones of the columns of cells in the array; and sensing voltages on one or more of the columns of cells in the array.

Other aspects and advantages of the present invention can be seen on review of the drawings, the detailed description and the claims, which follow.

BRIEF DESCRIPTION OF THE DRAWINGS

FIG. 27 is a schematic circuit diagram of a vertical U-shaped NAND-like string of variable resistance cells.

FIG. 28 is a schematic circuit diagram of an alternative vertical NAND-like string of variable resistance cells.

DETAILED DESCRIPTION

A detailed description of embodiments of the present invention is provided with reference to the FIGS. 1-36.

Figure 1:
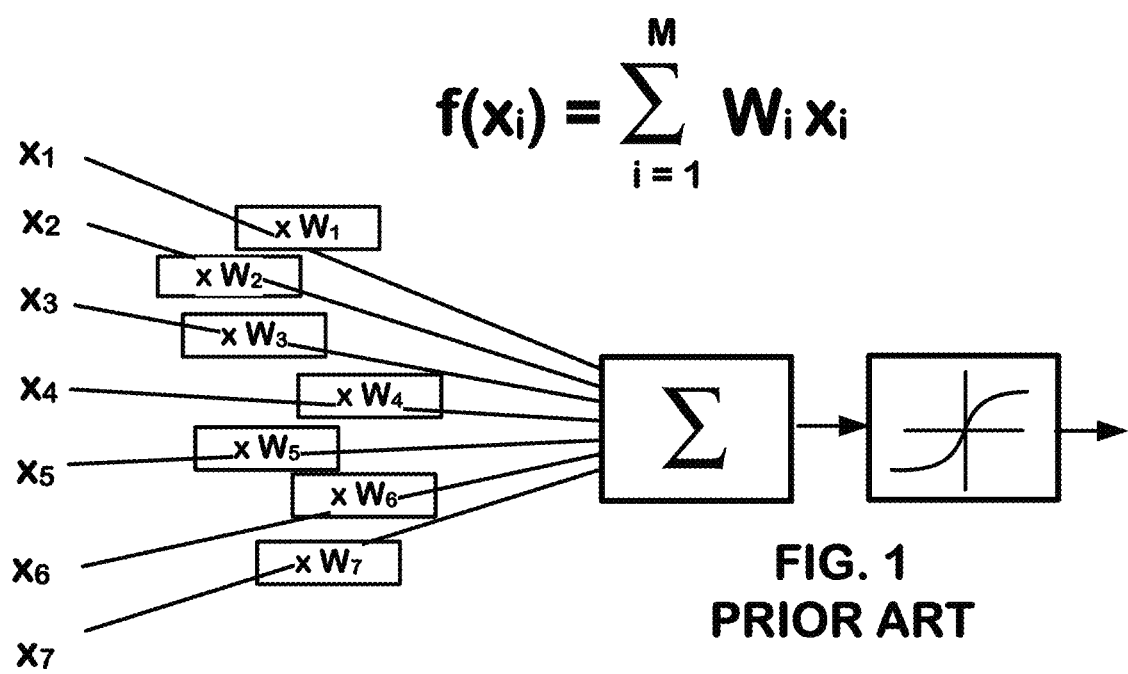
FIG. 1 is a functional diagram of a sum-of-products operation which can be a fundamental element of a neuromorphic computing system known in the prior art.

FIG. 1 is a diagram of a sum-of-products operation, where the terms of the summation are the product of input $X_i$ times a weight $W_i$, in this example, where i goes from 1 to 7. The weight $W_i$ can differ over the terms of the summation. In operation, the weights can be assigned as a set of coefficients, and then the inputs applied to compute a summation that changes as the inputs change. Also, in algorithms executing a learning procedure, the weights can be changed from time to time as the learning procedures change coefficients to learn from the summation that achieves a useable result.

In the illustrated example, the output of the summation is applied to a sigmoid function to produce an output that ranges in a non-linear fashion between a minimum and a maximum such as between 0 and 1. This is a common model of a synapse for example used in neuromorphic computing. Other activation functions can be used as well, such a logit function. The sum-of-products operation can be applied as well in configurations not neuromorphic or not otherwise considered to model neurological systems.

Figure 2:
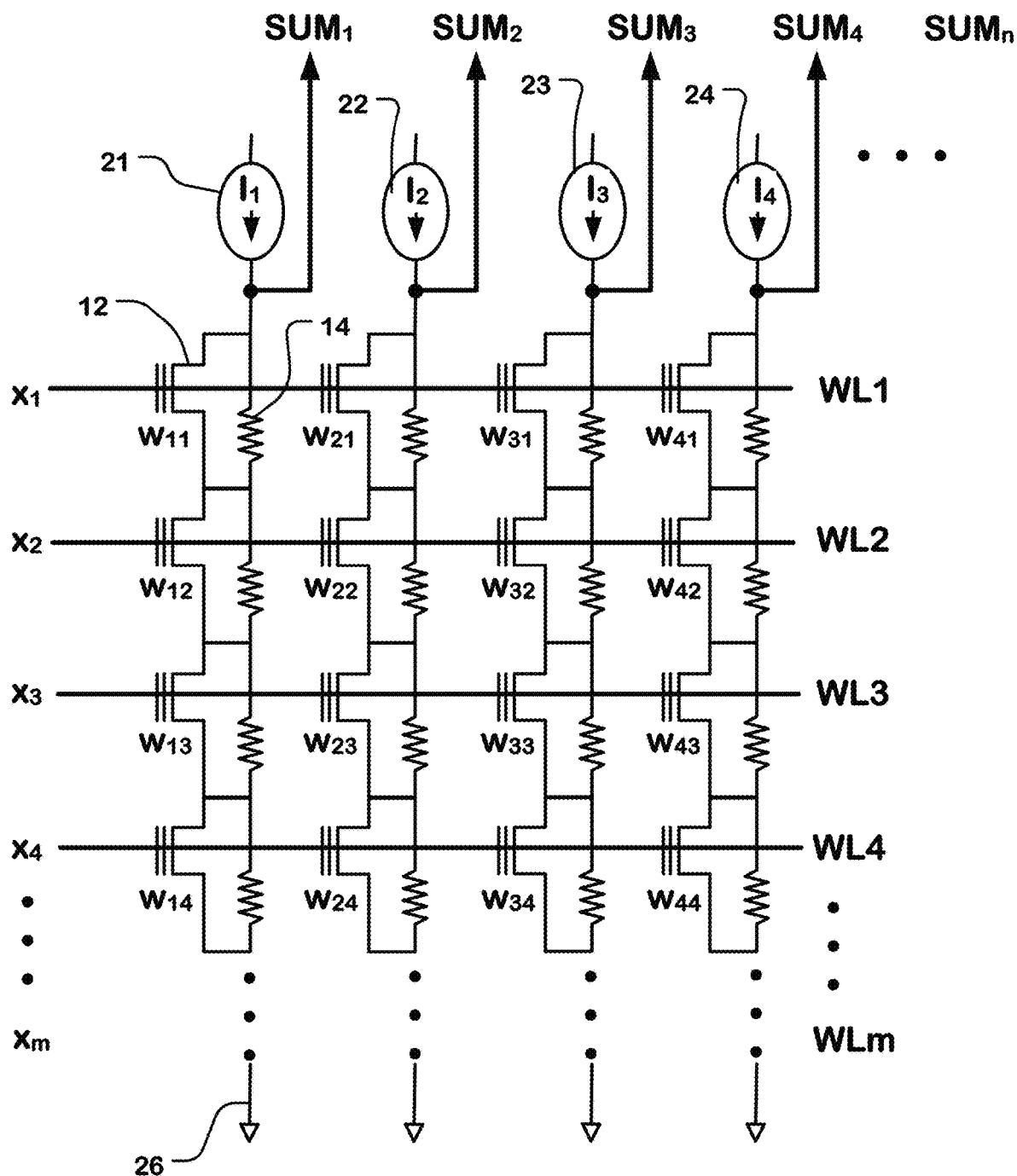
FIG. 2 illustrates a portion of an array of variable resistance cells configured for sum-of-products operations.

FIG. 2 is a schematic diagram of an array of variable resistance cells, where each of the cells in the array comprises a programmable threshold transistor (e.g. 12) and a resistor (e.g. 14) connected in parallel. In this illustration, the array includes four strings of variable resistance cells, where each string comprises four variable resistance cells in series between a summing node SUM1 to SUM4, and a reference line, such as ground (e.g. 26). Four word lines WL1 to WL4 are coupled to the control terminals of the variable resistance cells in each of the strings. As indicated in the figure, there can be any number of columns and summing nodes up to $SUM_n$, and any number of word lines up to $WL_m$. The variable resistance cells at column n and row m have weights $W_{nm}$ set as a function of the programmable threshold Vt of the cell, the resistance $R_{nm}$ of the resistor in the cell, and the current $I_n$ in the column.

A voltage applied to the word lines corresponds to the variable inputs $X_1$ to $X_4, \ldots X_m$. In this manner, the variable resistance of each of the variable resistance cells in the strings is a function of a voltage applied on the word line to the control gate of the cell, a threshold of the programmable threshold transistor in the cell, the current in the cell, and the resistor.

The summing nodes ($SUM_1$ to $SUM_4, \ldots SUM_n$) are coupled to a voltage sensing sense amplifier to generate a signal representing the sum-of-products output of each of the strings. A current source 21-24 is coupled to each of the strings to apply a constant current, in a representative example, to each string during the sensing operation.

Figure 3:
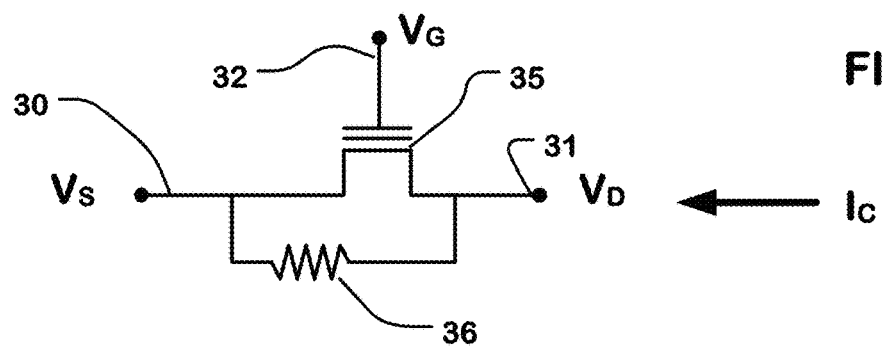
FIG. 3 is a schematic diagram of a variable resistance cell according to embodiments described herein.

FIG. 3 is a schematic diagram of one variable resistance cell, such as that used in the array of FIG. 2. The variable resistance cell includes a first current-carrying node 30, a second current-carrying node 31 and a control terminal 32. A programmable threshold transistor 35 and a resistor 36 are connected in parallel to the first and second current-carrying nodes. The programmable threshold transistor has a gate connected to the control terminal 32.

A voltage $V_G$ on the control terminal 32 can be characterized as a gate voltage for the programmable threshold transistor 35. The control terminal 32 can correspond to a word line in the array shown in FIG. 2. A voltage $V_S$ on the first current-carrying node 30 can be characterized as a source voltage for the cell. A voltage $V_D$ on the second current-carrying node 31 can be characterized as a drain voltage for the cell.

In this example, a cell current $I_C$ is applied to the second current-carrying node 31, having a current amplitude that is set in design, or adjustable, to establish a voltage drop in the cells, depending on the voltage range of the voltage sense amplifier, and the resistance values in the cells for the resistor 36. The current amplitude can be tuned according to a particular embodiment of the array, so that a usable range of voltages can be generated on the string for supply to the summing node. Also, the magnitude of resistance of the resistor and the configuration of the programmable threshold transistor can be designed to operate with the selected current level and a specified sensing range.

The programmable threshold transistor 35 can be implemented using a floating gate memory cell, a split gate floating gate memory cell, a dielectric charge trapping memory cell, such as a SONOS device or other types of dielectric charge trapping cells known as for example BE-SONOS and TANOS, and a split gate, dielectric charge trapping memory cell. Other programmable memory cell technologies, such as phase change memory, metal oxide memory, and so on, may be utilized as well.

Also, in embodiments of the technology, the resistor 36 can be implemented as a buried implant resistor between source and drain terminals of the programmable threshold transistor 35.

Figure 36:
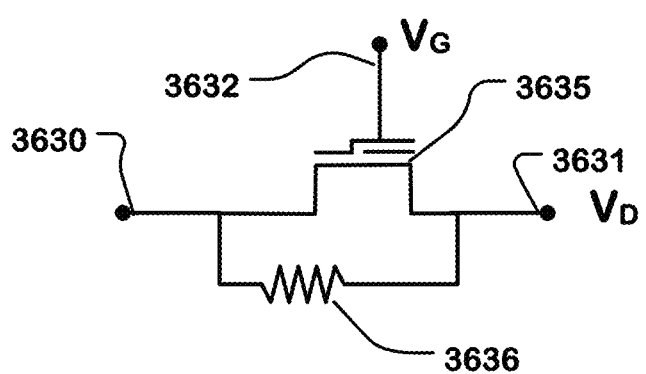
FIG. 36 is a schematic diagram of a split-gate variable resistance cell according to embodiments described herein.

FIG. 36 is a schematic diagram of one split-gate variable resistance cell, such as can be used in the modified version of the array of FIG. 2. The variable resistance cell includes a first current-carrying node 3630, a second current-carrying node 3631 and a control terminal 3632. The control terminal is separated from the channel by a charge trapping layer over a portion of the channel length, and by a gate dielectric that does not trap charge for data storage over the balance of the channel length. A programmable threshold transistor 3635 and a resistor 3636 are connected in parallel to the first and second current-carrying nodes. The programmable threshold transistor has a gate connected to the control terminal 3632.

A voltage $V_G$ on the control terminal 3632 can be characterized as a gate voltage for the programmable threshold transistor 3635. The control terminal 32 can correspond to a word line in the array shown in FIG. 2. A voltage $V_S$ on the first current-carrying node 30 can be characterized as a source voltage for the cell. A voltage $V_D$ on the second current-carrying node 31 can be characterized as a drain voltage for the cell.

Figure 4:
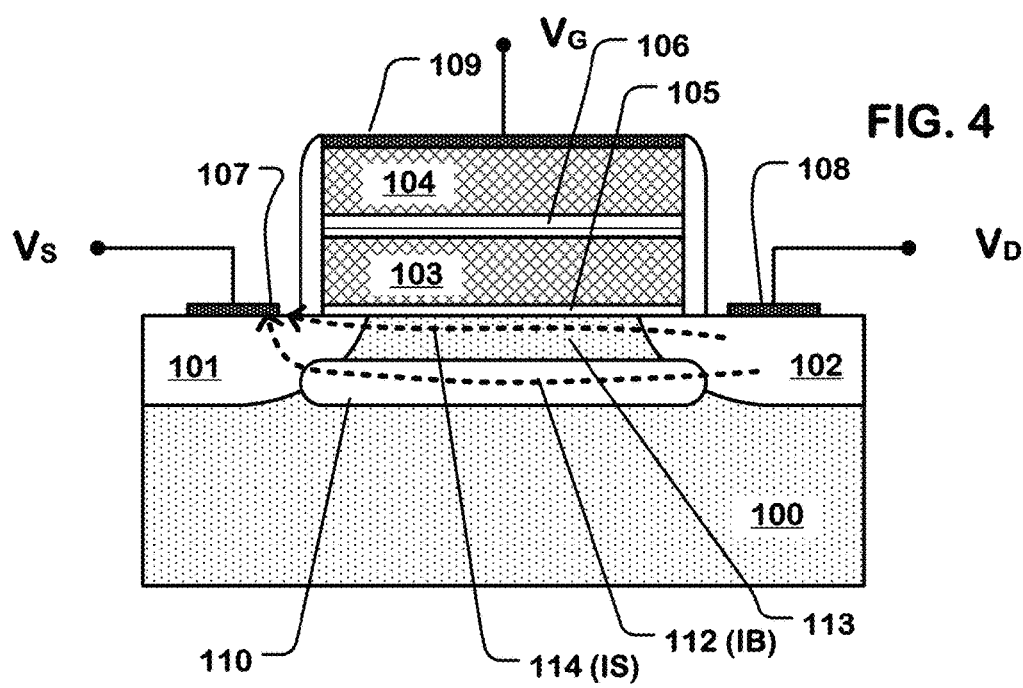
FIG. 4 is a simplified cross-section of a variable resistance cell including a floating gate memory transistor and a buried implant resistor.

FIG. 4 is a simplified cross-section of a floating gate device having a resistor connected in parallel with its channel, and the resistor being implemented using an ion implantation process which results in a buried implant resistor 110.

In this example, the device is implemented on a substrate 100, which can be a p-type substrate. A source terminal 101 and a drain terminal 102 are implemented by n-type ion implantation in the substrate 100. The source terminal 101 and the drain terminal 102 have contacts 107, 108 formed thereon, coupled to a source node having voltage $V_S$ and a drain node having voltage $V_D$. A p-type channel region 113 is disposed between the buried implant resistor 110 and a gate dielectric layer 105 (tunnel oxide) that overlies the substrate 100 between the source terminal 101 and the drain terminal 102. A floating gate polysilicon layer 103 is disposed over the gate dielectric layer 105. An inter-poly dielectric 106 is disposed over the floating gate polysilicon layer 103, implemented in some embodiments using a multilayer structure comprising silicon oxide, silicon nitride, and silicon oxide layers (ONO). A control gate polysilicon layer 104 is disposed over the inter-poly dielectric 106. A contact layer 109 is formed over the control gate polysilicon layer 104. Sidewall structures (not numbered) are formed along the sidewalls of the gate stack.

The structure shown in FIG. 4 can be implemented using floating gate cell manufacturing technologies, modified by an additional doping step to form the buried implant resistor 110. The buried implant resistor 110 connects the source terminal 101 and the drain terminal 102 to act as a passive resistor. In this manner, the floating gate device and the buried implant resistor 110 provide a programmable threshold transistor and a resistor connected in parallel between a first current carrying terminal, the source terminal 101, and a second current carrying terminal, the drain terminal 102.

In FIG. 4, a current path 112 is illustrated that passes through the buried implant resistor 110 between the source terminal 101 and the drain terminal 102. Also, a current path 114 is illustrated, which is activated when the gate voltage and charge trapped in the floating gate, in combination with a source voltage $V_S$, result in current flow through the channel of the transistor.

Thus, the device has a variable resistance (or variable conductance) that is a function of the resistance of the buried implant resistor 110, and the resistance of the channel of the floating gate device. The resistance of the channel of the floating gate device is a function of the gate voltage, and of the charge trapped in the floating gate.

Figure 5:
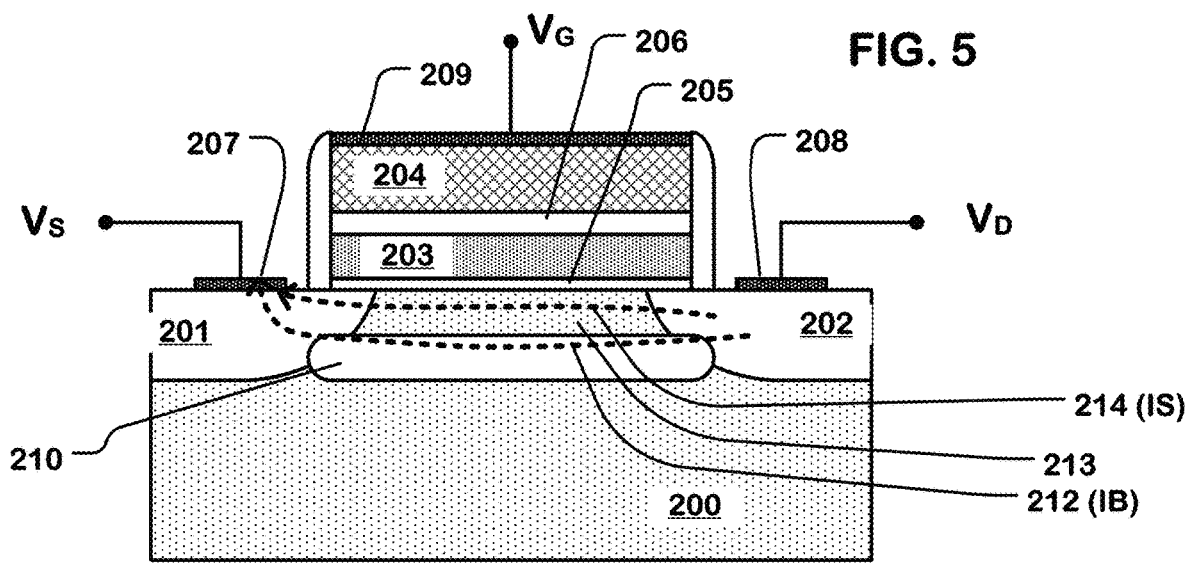
FIG. 5 is a simplified cross-section of a variable resistance cell including a dielectric charge trapping memory transistor and a buried implant resistor.

FIG. 5 is a simplified cross-section of a dielectric charge trapping device having a resistor connected in parallel with its channel, and implemented using an ion implantation process which results in a buried implant resistor 210.

In this example, the device is implemented on a substrate 200, which can be a p-type substrate. A source terminal 201 and a drain terminal 202 are implemented by n-type ion implantation in the substrate 200. The source terminal 201 and the drain terminal 202 have contacts 207, 208 formed thereon, coupled to a source node having voltage $V_S$ and a drain node having voltage $V_D$. A p-type channel region 213 is disposed between the buried implant resistor 210 and a tunneling dielectric layer 205 that overlies the substrate 200 between the source terminal 201 and the drain terminal 202. A dielectric charge trapping layer 203 is disposed over the tunneling dielectric layer 205. A blocking dielectric 206 is disposed over the dielectric charge trapping layer 203. A control gate polysilicon layer 204 is disposed over the blocking dielectric 206. A contact layer 209 is formed over the control gate polysilicon layer 204. Sidewall structures (not numbered) are formed along the sidewalls of the gate stack.

The structure shown in FIG. 5 can be implemented using dielectric charge trapping memory cell manufacturing technologies, modified by an additional doping step to form the buried implant resistor 210. The buried implant resistor 210 connects the source terminal 201 and the drain terminal 202 to act as a passive resistor. In this manner, the dielectric charge trapping device and the buried implant resistor 210 provide a programmable threshold transistor and a resistor connected in parallel between the source terminal 201 and the drain terminal 202.

In FIG. 5, a current path 212 is illustrated that passes through the buried implant resistor 210 between the source terminal 201 and the drain terminal 202. Also, a current path 214 is illustrated, which is activated when the gate voltage and charge trapped in the dielectric charge trapping layer, in combination, result in current flow through the channel of the device.

Thus, the device has a variable resistance (or conductance) that is a function of the resistance of the buried implant resistor 210, and the resistance of the channel of the dielectric charge trapping device. The resistance of the channel of the dielectric charge trapping device is a function of the gate voltage, and of the charge trapped in the dielectric charge trapping gate.

In both of the embodiments of FIG. 4 and FIG. 5, a cell is illustrated that consists of one transistor and one resistor (1T-1R). Furthermore, the embodiments of FIG. 4 and FIG. 5 can implement the resistor as a buried implant resistor within the layout footprint of a single variable threshold transistor, in effect making an array of one transistor (1T) cells, for a very compact layout configured for sum-of-products operations with voltage sensing.

In operation, the cells illustrated in FIGS. 4 and 5 can be characterized as follows.

While the gate-to-source voltage $V_{GS}$ is less than the threshold voltage Vt, current can flow in the buried implant resistor but no transistor channel ("surface channel") is formed, allowing only current $I_B$ in the buried resistor. Thus, the current in the cell is equal to $I_B$ and the resistance of the cell is equal to the drain-to-source voltage $V_{DS}$ divided by the current $I_B$.

While the gate-to-source voltage $V_{GS}$ is greater than the threshold voltage Vt, both the surface channel current $I_S$ and the buried resistor current $I_B$ are induced. The channel resistance can be much less than the resistance of the buried resistor, and so $I_S$ can dominate when the transistor is on. Thus, the current $I_n$ in the column is divided in the cell so that it is equal to the sum $I_S+I_B$, and the cell resistance is equal to the drain-to-source voltage $V_{DS}$ divided by the current $I_n$.

Since the threshold of the floating gate or dielectric charge trapping cell is programmable, this cell resistance can emulate a product of a parameter X(i) represented by the gate voltage, and a parameter W(i) represented by the charge trapped in the cell, the resistance of the resistor in the cell and the cell current. The parameter W(i) can be a binary value, where the cell operates in one of two states ($I_B$ only higher resistance state and $I_B+I_S$ lower resistance state). If the cell is operated in the linear region for FET behavior, then the parameter W(i) can be analog, and vary in range according the charge trapped in the cell.

Figure 6:
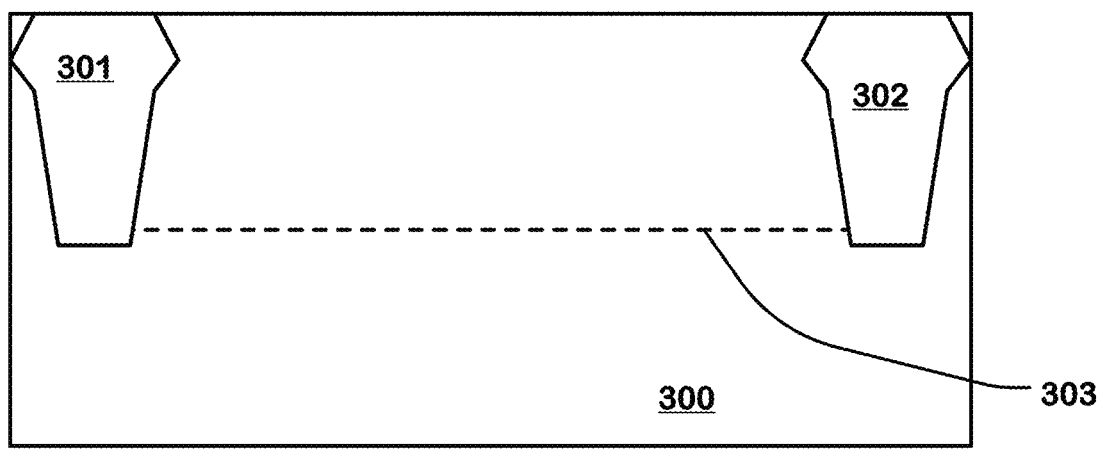
FIGS. 6-9 illustrate stages in a manufacturing process for a variable resistance cell according to an embodiment described herein.

FIGS. 6-9 illustrate stages in a manufacturing process that can be used to implement a cell like that of FIG. 4. In FIG. 6, a substrate 300 is shown after formation of shallow trench isolation structures 301 and 302 that provide dielectric boundaries for a cell. Also, a well implant has been applied to form a p-type well represented by the boundary 303 providing a region in the substrate 300 in which the cells are formed. Different blocks of cells in an array can be implemented in separate blocks, allowing independent biasing of the wells for the separate blocks.

Figure 7:
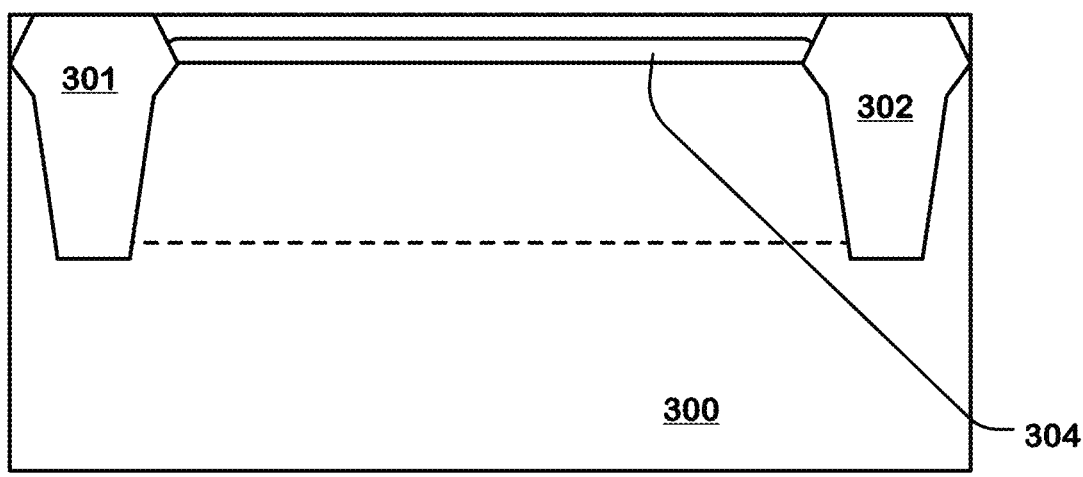

FIG. 7 illustrates a stage after a buried channel implant of n-type dopants such as phosphorus and arsenic are applied to form a buried implant resistor 304 between the shallow trench isolation structures 301 and 302.

Figure 8:
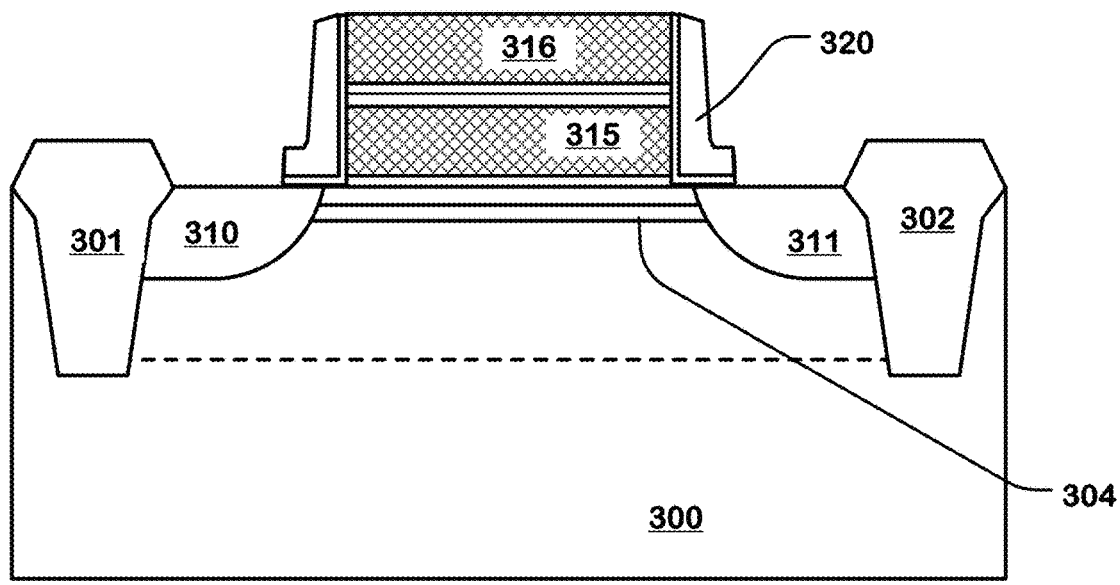

FIG. 8 illustrates a stage after formation of the gate stack structures (floating gate 315, control gate 316, tunneling dielectric and interpoly dielectric along with sidewalls 320) and formation of source and drain regions 310 and 311 using an implant of n-type dopants.

Figure 9:
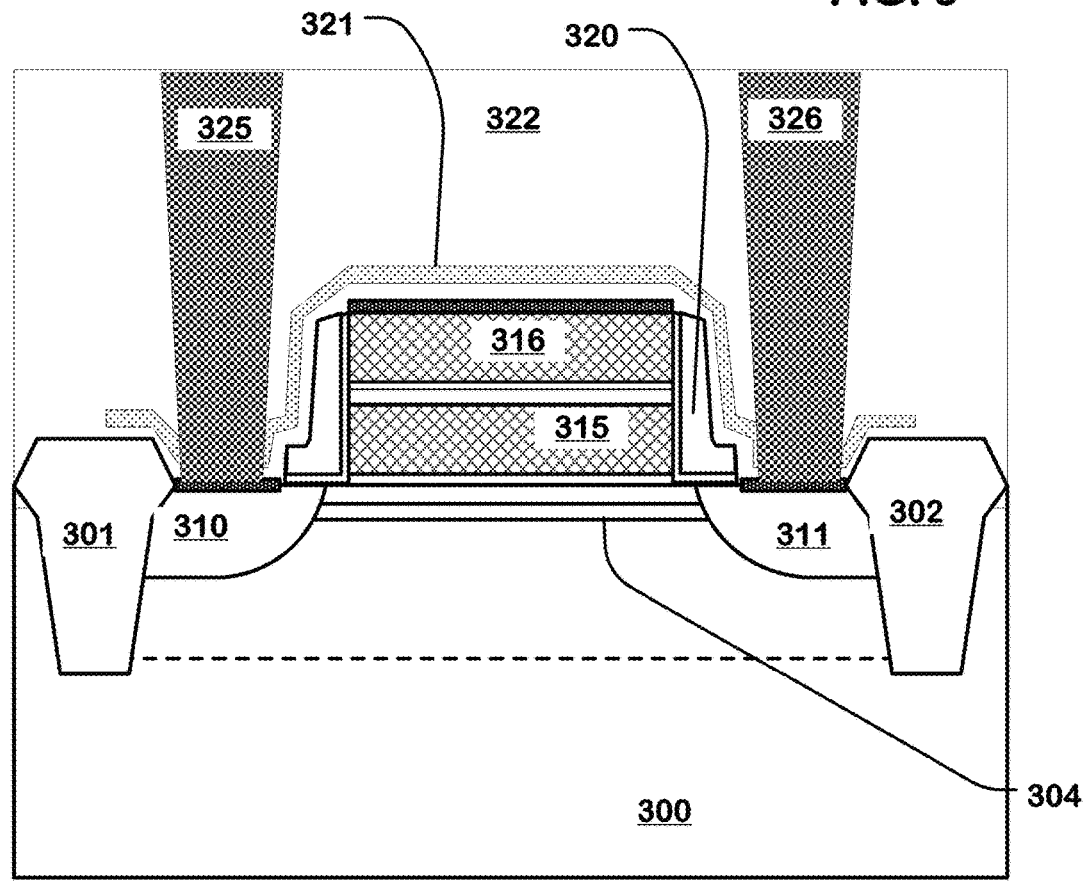

FIG. 9 illustrates a stage in the manufacturing after formation of an interlayer dielectric 322 and interlayer contacts 325 and 326. The structures are formed in the illustrated example, using a process that forms silicide contacts on the source and drain regions, followed by a thin dielectric and an etch stop layer 321 over the gate stack and source and drain regions 310 and 311. The interlayer dielectric 322 is deposited, and vias are etched to form openings in which the source and drain contacts 325 and 326 are formed by tungsten deposition or other techniques.

As can be seen, a variable resistance cell such as that shown in FIG. 4 is manufactured according to these procedures. These same procedures, can be modified for the purposes of manufacturing a cell such as that shown in FIG. 5, by modifying the gate stack including the gate dielectric, the charge trapping layer, the blocking layer and the control gate.

Variable resistance cells having structures like that shown in FIGS. 4 and 5 can be arranged in series using patterned conductor layers connected to contacts 325, 326.

Figure 10A:
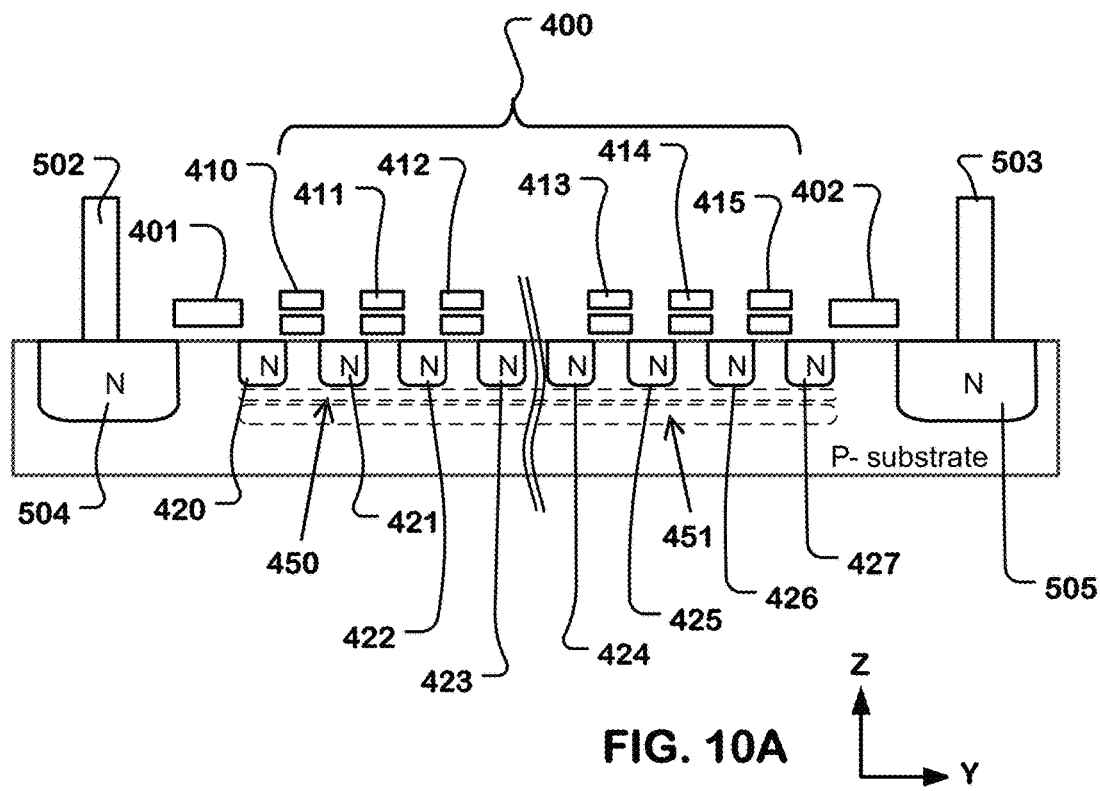
FIGS. 10A and 10B are cross-section and layout views of variable resistance cells arranged in series in a NAND-like structure.
Figure 10B:
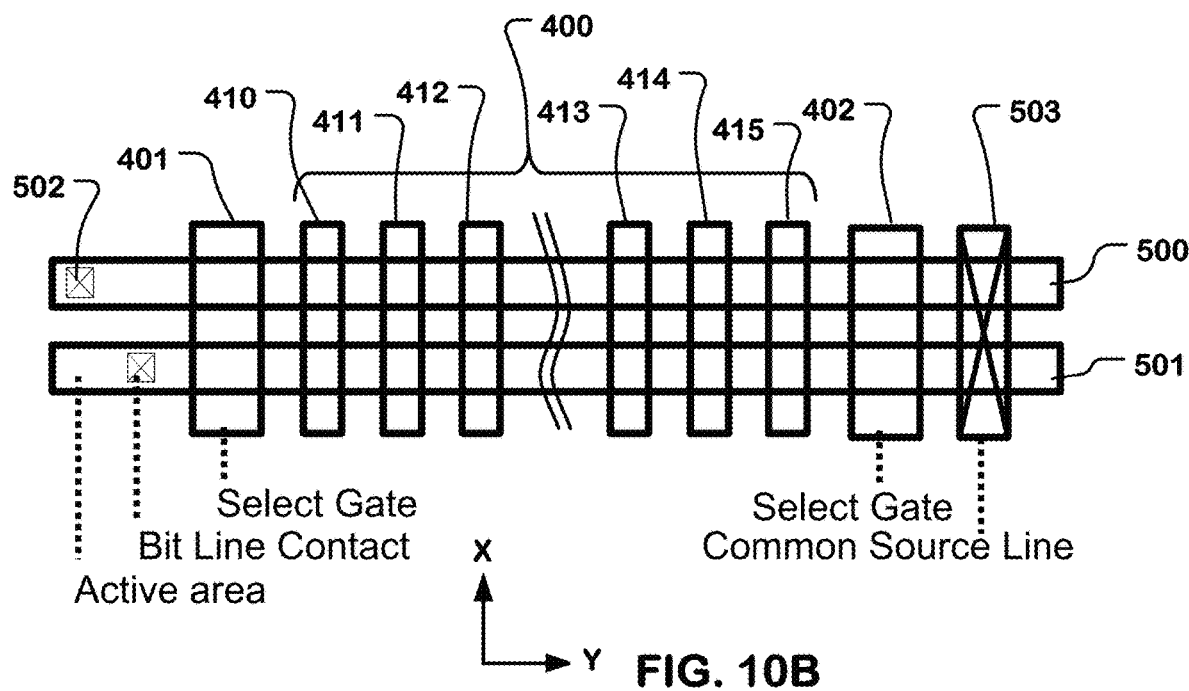

FIGS. 10A and 10B are cross-section and layout views of variable resistance cells arranged in series in a 2D NAND-like structure.

FIG. 10A shows a simplified cross-section of a substrate in which a series-connected string 400 of variable resistance cells is formed. The gate stacks 410-415, including charge trapping layers (floating gate or dielectric) and word lines, overlie the substrate and extend as elements of word lines in a direction perpendicular to the drawing page. In representative implementations, there may be for example 32 or 64 active word lines. In some embodiments, the series-connected strings may include a smaller number of active word lines or a larger number as suits a particular implementation. In some cases, there may be one or more dummy word lines which can be on opposing ends of the strings as is typical for example in high density NAND flash memory. Dummy word lines can be implemented for manufacturing quality or biasing purposes but not used in the sum-of-products operations of the string.

In this example, the substrate is a p-type substrate, and current carrying terminals (i.e. source/drain terminals) of the variable resistance cells are implemented by n-type implants 420-427. In some high density embodiments, implants are not used in current carrying terminals between the cells, so the current carrying terminals rely on inversion for charge carriers as in the channel regions. No contacts are made directly to the current carrying terminals between all the cells in a NAND-like embodiment as illustrated.

String select word lines 401 and 402 are disposed on opposing ends of the series-connected strings. Active regions 504 and 505 comprise n-type implants in the substrate used for bit line and common source line connections for the series-connected strings. The active regions 504 and 505 can be deeper implants or higher conductivity implants then the current carrying terminals of the variable resistance cells. A bit line contact 502 connects the active region 504 to a bit line in an overlying patterned conductor layer. A source line contact 503 connects the active region 505 to a source line in an overlying patterned conductor layer.

An n-type buried implant resistor 451 is implemented, extending in this example from the edge of a channel of a select gate controlled by the bit line side string select word line 401, to the edge of the channel of a select gate controlled by source line side string select word line 402. In this manner, the select gates operate to connect and disconnect the buried implant resistor 451 to the active regions 504, 505.

In this example, a p-type guard layer 450, having a higher p-type impurity concentration than the channel regions of the variable resistance cells, is disposed between the channels and the buried implant resistor 451. The p-type guard layer 450 helps to shield the buried implant resistor 451 from the gate voltage, and maintain the stability of the parallel resistance value.

FIG. 10B is a plan view diagram of series connected strings of variable resistance cells implemented as shown in FIG. 10A. Common reference numerals (401, 402, 410-415) are given to the gate stacks (including word lines) and select lines. Likewise, the common reference numbers 502, 503 are given to bit line and source line contacts.

FIG. 10B shows two series connected strings arranged in parallel with bit lines 500, 501, which are implemented in overlying patterned conductor layers above the gate stacks 410-415.

FIG. 27 is a schematic diagram of a U-shaped vertical NAND-like string 2700 including variable resistance cells that comprise resistors (e.g. 2701) in parallel with programmable threshold, charge trapping memory cells (e.g. 2702) operable as a sum-of-products accelerator as described herein. In FIG. 27, the NAND-like string includes a U-shaped string coupled to a bit line BL, including in series a string select switch SSL, a first plurality of cells coupled to respective word lines WL on the right side, an assist gate AG at the bottom of the structure, a second plurality of cells coupled to respective word lines WL on the left side, and a ground select switch GSL coupled to a source reference line CS. The inputs of the operation are applied to the word lines WL and configurations as described herein. The outputs can be sensed on the bit lines or the reference lines, using voltage and current sensing technologies or other sensing technologies.

Figures 29, 30:
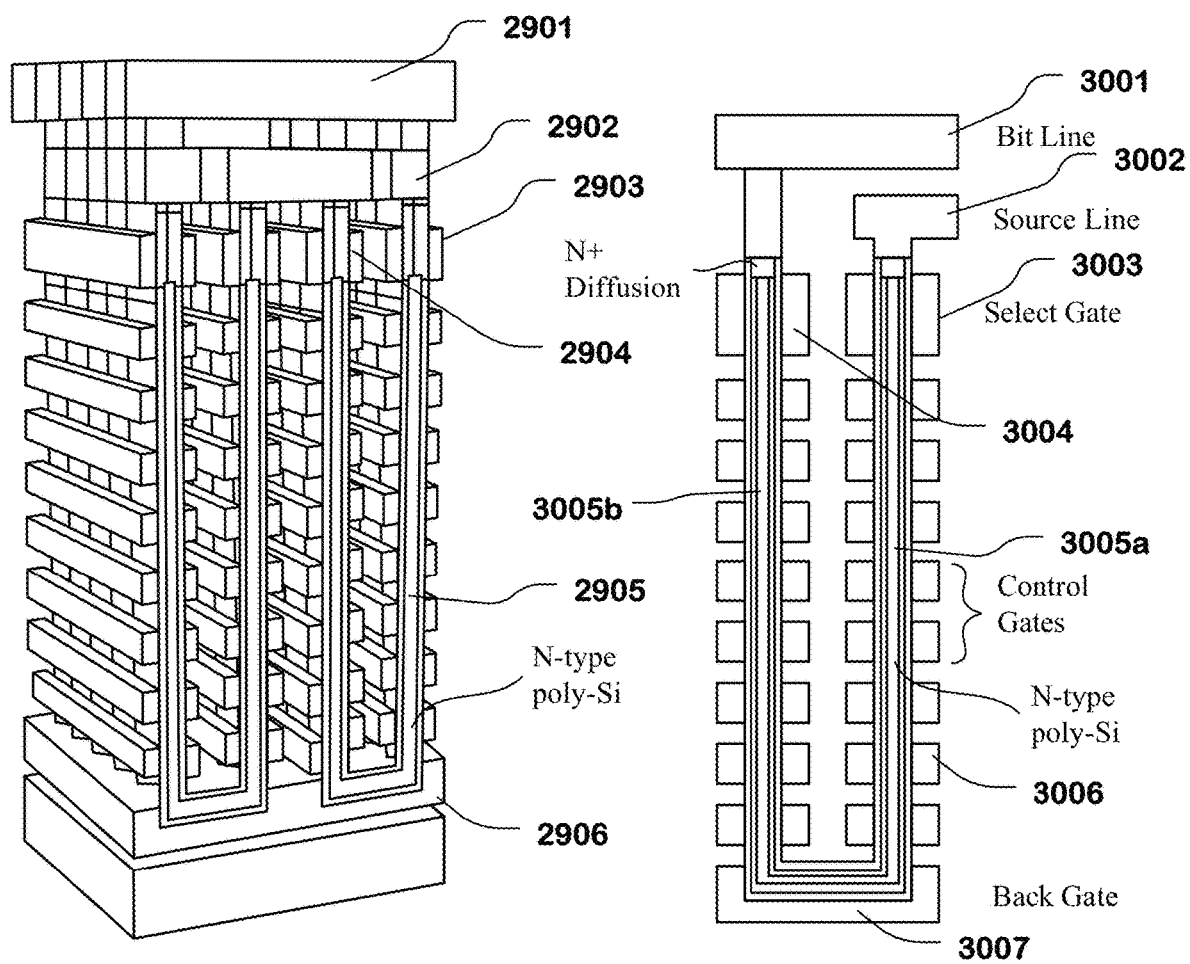
FIG. 29 is a perspective of a 3D array of vertical U-shaped NAND-like strings of variable resistance cells.
FIG. 30 is a cross-section view of a single vertical U-shaped NAND-like string of variable resistance cells, which can be implemented in an array like that of FIG. 29.

FIG. 28 is a schematic diagram of an alternative vertical structure including a first NAND-like string 2800 and a second NAND-like string 2801, which comprise variable resistance cells that comprise resistors in parallel with programmable threshold, charge trapping memory cells, operable as a sum-of-products accelerator as described herein. In FIG. 29, the first NAND-like string extends between a first bit line BL and a source reference line CS, and includes a string select gate SSL, a plurality of word lines WL, and a ground select gate GSL in series. Likewise, the second NAND-like string extends between a second bit line BL and the source reference line CS, and includes a string select gate SSL, a plurality of word lines WL and a ground select gate GSL in series. The inputs of the operation are applied to the word lines WL and configurations as described herein. The outputs can be sensed on the bit lines or the reference lines, using current sensing technologies or other sensing technologies.

FIGS. 29-35 illustrate various structures which can be utilized to implement vertical NAND-like embodiments. In FIG. 29, U-shaped NAND-like strings similar to that of FIG. 27 are implemented in a dense 3D array. The structure includes a first patterned metal layer 2901 in which bit lines are implemented. The second patterned metal layer 2902 includes the reference lines. A select gate layer includes string select lines 2903 and ground select lines 2904. Vertical channel structures 2905 extend through word lines in a plurality of layers. The vertical channel structures are connected in a U-shaped pattern supported by an assist gate structure 2906. The vertical channel structures include a data storing layer such as a charge trapping structure, and an N-type polysilicon doped vertical channel, having a native resistance. The vertical channel structures are surrounded by the word lines in each level of the structure, making so-called gate-all-around variable resistance cells. Thus, when an input on a word line does not turn on the charge trapping cell, then the resistance is determined by the resistivity of the vertical channel. When the input on the word line does turn on the charge trapping cell, the resistance is determined by the parallel resistance of the charge trapping cell and the resistivity of the vertical channel. See, Tanaka, H., et al., "Bit Cost Scalable Technology with Punch and Plug Process for Ultra High Density Flash Memory," 2007 Symp. VLSI Tech., Digest of Tech. Papers, pp 14-15.

FIG. 30 shows a single U-shaped NAND-like string, which can be implemented in an array like that of FIG. 29. A bit line 3001 is connected via a select gate 3004 to a series of variable resistance cells on the left side on vertical channel structure 3005a, and through a horizontal extension of the vertical channel structure and a back gate 3007 to a second vertical string of variable resistance cells on the opposite vertical channel structure 3005b. The second vertical string of variable resistance cells is coupled through select gate 3003 to a source line 3002. Each of the strings includes a plurality of word lines (e.g. 3006) to which inputs of the operation are applied in configurations as described herein. The vertical channel structure 3005a, 3005b on both sides of the U-shaped NAND-like string can comprise n-type doped polysilicon to provide a buried resistor, formed by in situ doping or by implantation.

Figure 31:
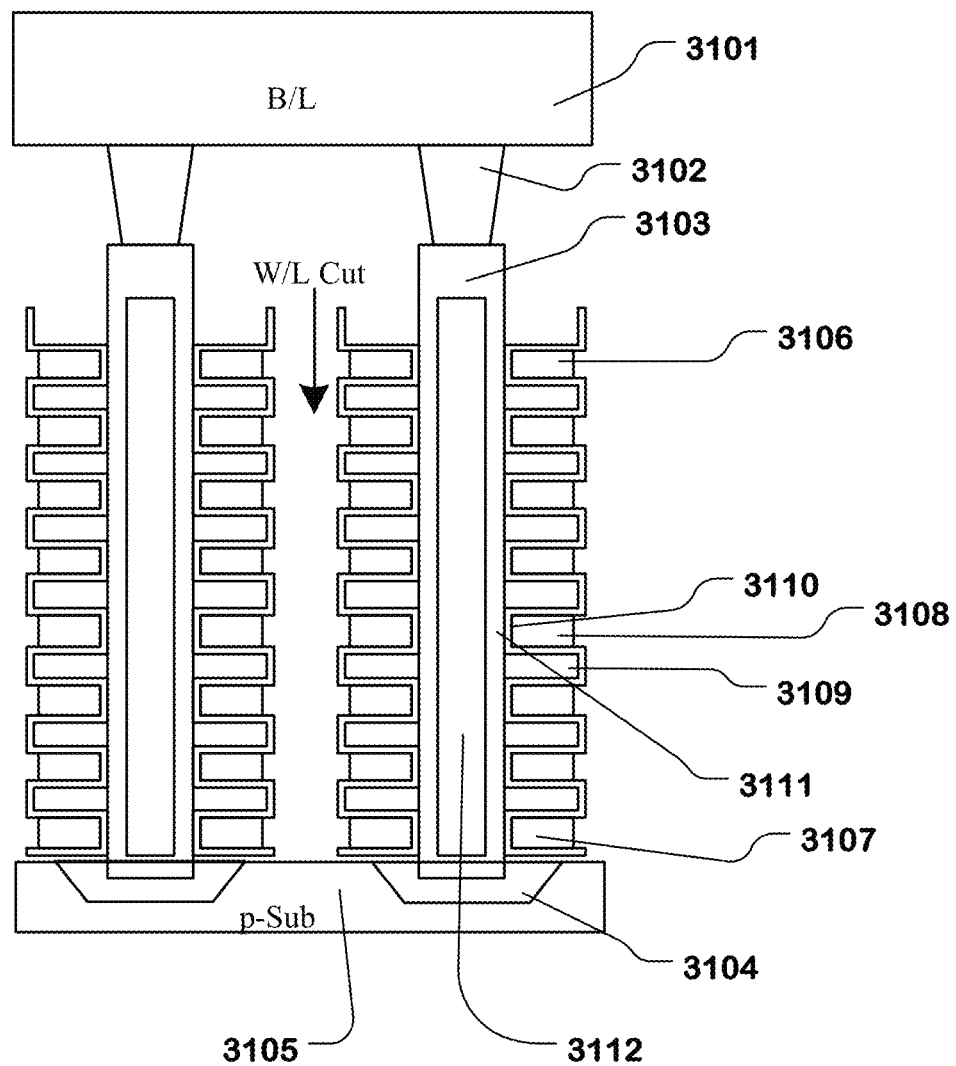
FIG. 31 illustrates yet another type of 3D array of vertical NAND-like strings of variable resistance cells as described herein.

FIG. 31 illustrates an alternative vertical NAND-like string implementing circuits like that of FIG. 28. In the structure of FIG. 31, a bit line 3101 is implemented in a first patterned metal layer. The bit line 3101 is connected by interlayer connections 3102 to a vertical channel structure 3103. Vertical channel structure 3103 comprises a thin film of semiconductor material 3111 which extends along the sides of the vertical channel structure. The interior of vertical channel structure 3103 in this embodiment comprises a doped polysilicon 3112 to provide buried resistors. The vertical channel structure 3103 extends between a plurality of stacks of conductors which are configured as string select lines 3106 and ground select lines 3107 on opposite ends of the string, and word lines 3108 in between. The vertical channel structure 3103 is coupled to a common source line diffusion 3104 and a substrate 3105. A charge trapping layer 3110 is disposed between the conductors acting as word lines (e.g. 3108) and the thin film of semiconductor material 3111 in the vertical channel structure 3103. Dielectric layers 3109 separate the strips of conductive material acting as word lines and string select lines. As string select lines 3106 on opposing sides of the vertical channel structure 3103 are separate, these vertical NAND-like strings can share a single bit line 3101. See, Jang, et al., "Vertical Cell Array using TCAT (Terabit Cell Array Transistor) Technology for Ultra High Density NAND Flash Memory", 2009 Symposium on VLSI Technology Digest of Technical Papers.

Figures 32, 33:
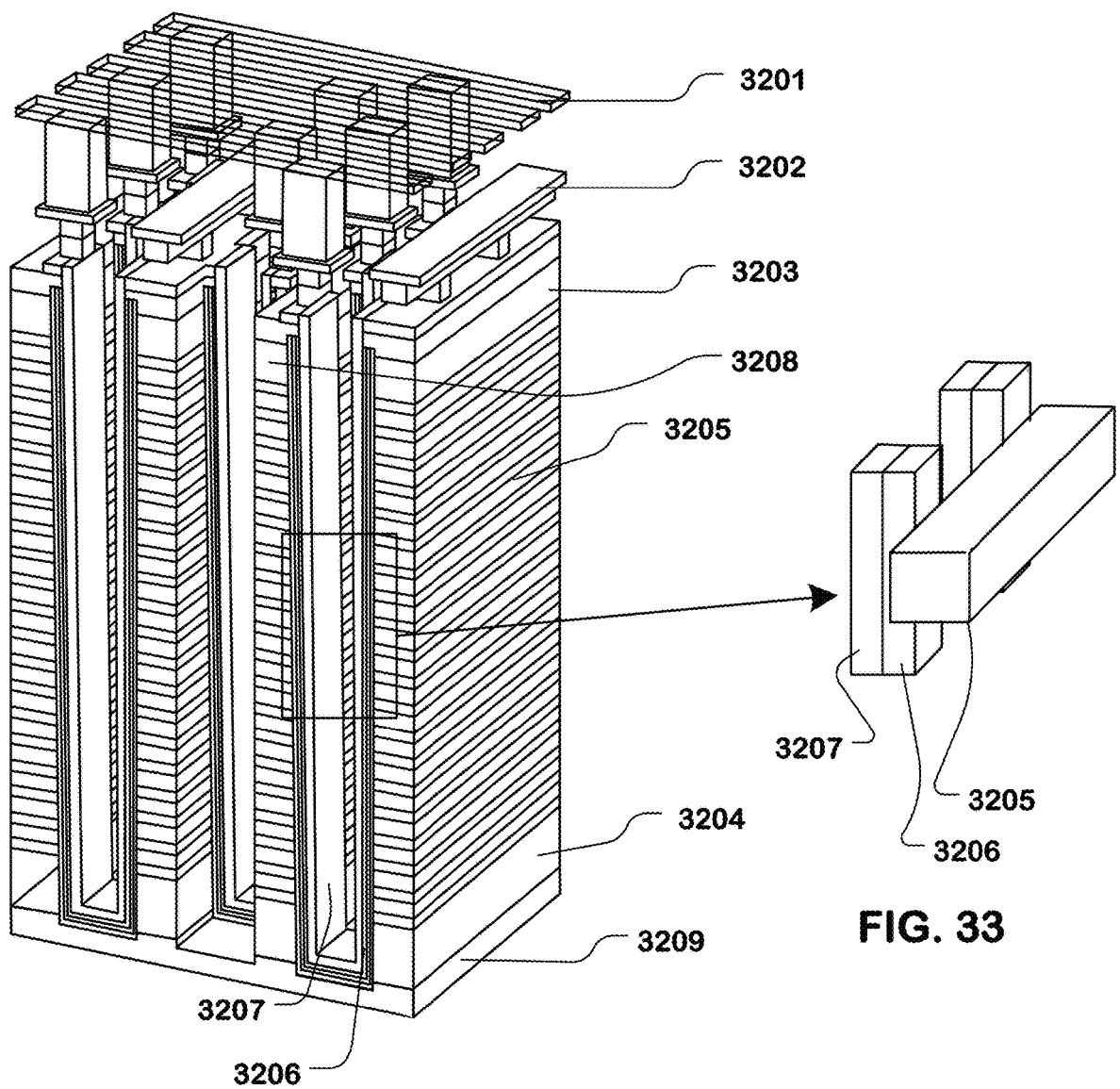
FIG. 32 illustrates a vertical channel single gate structure comprising vertical U-shaped NAND-like strings of variable resistance cells according to yet another embodiment.
FIG. 33 is a close-up view of variable resistance cells of the array of FIG. 32.

FIG. 32 illustrates a dense 3D array comprising single gate, U-shaped vertical NAND-like strings of variable resistance cells as described herein that comprise the resistor in parallel with a charge trapping memory cell. In this structure, bit lines are implemented in a first patterned metal layer 3201 and source lines are implemented in a second patterned metal layer 3202. The bit lines and source lines are connected by interlayer connectors to vertical channel structures that comprise a U-shaped thin film of semiconductor material used as a channel and a buried resistor in embodiments of the structure described herein. The vertical channel structures extend between a plurality of stacks of conductors that are configured as string select lines 3208 or ground select lines 3203, word lines (e.g. 3205) and assist gate lines 3204. These conductors are separated by insulating material. The vertical channel structure includes a charge trapping layer 3206, and a thin film channel layer 3207 which extends in the U-shaped pattern. The structure overlies insulating layer 3209. The thin film channel layer 3207 can comprise a doped polysilicon, form by in situ doping of the polysilicon film, or deposition of doped polysilicon. See, U.S. Pat. Nos. 9,698, 156 and 9,524,980.

FIG. 33 illustrates two vertical channel variable resistance cells coupled to a word line 3205. The variable resistance cells each include charge trapping layer 3206, and doped thin film channel layer 3207.

The conductors in the stack configured as word lines can be used to apply inputs for operation of the array of NAND-like strings as a sum-of-products accelerator structure.

Figure 34:
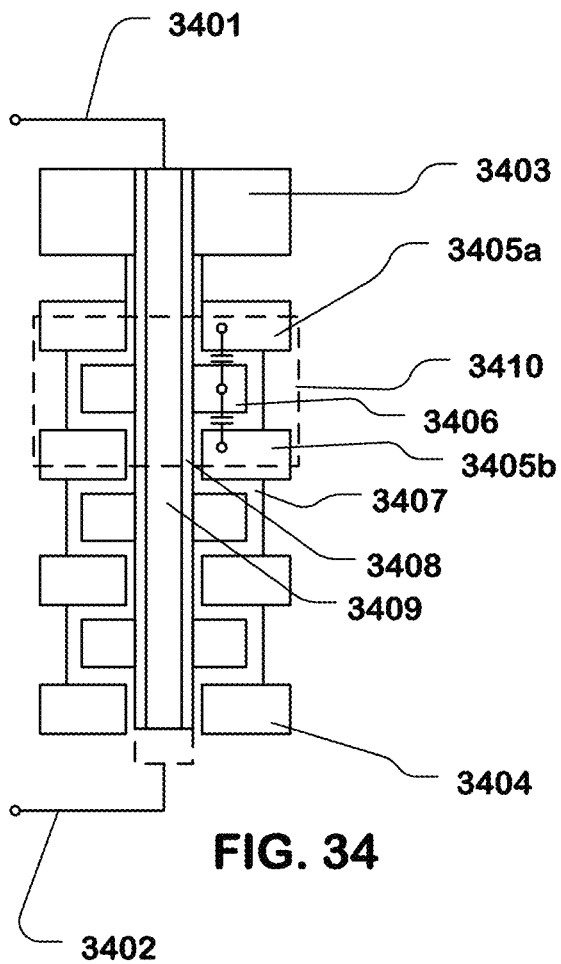
FIG. 34 is a cross-section view of a vertical, shared floating gate type NAND-like structure including variable resistance cells as described herein.

FIG. 34 illustrates yet another vertical NAND-like structure including variable resistance cells as described herein. In this example, this series of cells is coupled between a bit line 3401 and a source line 3402. A stack of conductors including conductors configured as select gates 3403 and 3404, and conductors configured as word lines (e.g. 3405a and 3405b). Shared floating gate structures (e.g. 3406) are disposed between the conductors configured as word lines (e.g. 3405a, 3405b). The vertical channel structure includes a tunneling dielectric layer 3408, and a doped semiconductor core 3409, such as n-type doped polysilicon, doped in order to behave as the buried resistor of the variable resistance cells. An inter-poly dielectric layer 3407 separates the conductors configured as word lines from the vertical channel structure and from the floating gates.

Figure 35:
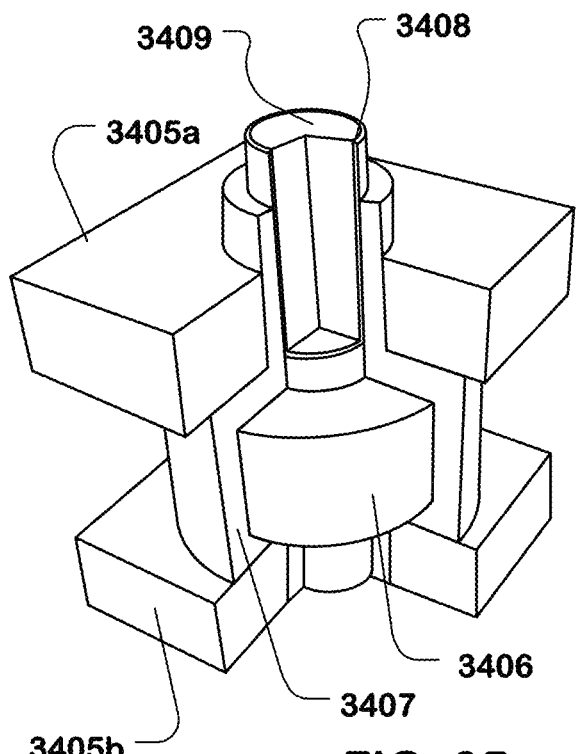
FIG. 35 is a close-up view of a shared floating gate type NAND-like variable resistance cell of the string of FIG. 34.

FIG. 35 illustrates the structure from the block 3410 of FIG. 34. As can be seen, a vertical channel structure including a doped polysilicon core 3409, and a tunneling dielectric layer 3408 is disposed through, and is surrounded by, the conductors configured as word lines 3405a and 3405b, and the floating gate structure 3406. Inter-poly dielectric layer 3407 separates the conductors configured as word lines 3405a and 3405b from the vertical channel structure (including core 3409), and from the floating gate structure 3406. See, Seo, et al., "A Novel 3-D Vertical FG NAND Flash Memory Cell Arrays Using the Separated Sidewall Control Gate (S-SCG) for Highly Reliable MLC Operation", 2011 IEEE.

Embodiments of sum-of-products arrays utilizing variable resistance cells can have very large arrays, including arrays having thousands or millions of variable resistance cells. Manufacturing techniques that are utilized for large-scale 2D and 3D NAND devices can be applied, with the addition of steps for implementation of the buried implant resistors or other resistor structures, in the manufacturing of large sum-of-products arrays implemented in NAND-like structures as shown in FIGS. 10A and 10B and FIGS. 27-36. Operating techniques for writing (program and erase) weights to the programmable resistance cells can be like those utilized for large-scale NAND devices can be applied. As mentioned above, the programmable resistance cells can be operated in an analog mode. In the analog mode, peripheral circuitry for sensing circuitry and signal routing can be complex.

The peripheral circuitry can be simplified by configuring the programmable resistance cells in the array of cells to operate in a "binary" mode. The programmable threshold transistors can store binary state. The current applied to the columns can be constant, or applied in a fixed number of binary levels. The resistors in the programmable resistance cells can be constant throughout the array, or be implemented in a fixed number of binary levels of resistance.

Binary mode operation can allow simplification of the peripheral circuits, by reducing the complexity of the programming algorithms needed to program the threshold in the cells, the current sources used to apply current to the columns in the array and the sensing circuitry used to generate output values.

Figure 11A:
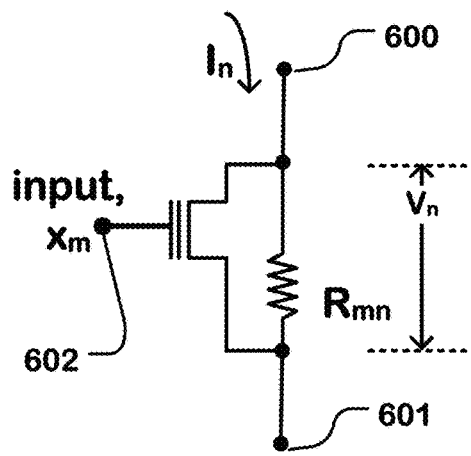
FIGS. 11A and 11B are illustrated to demonstrate operation of a variable resistance cell.
Figure 11B:
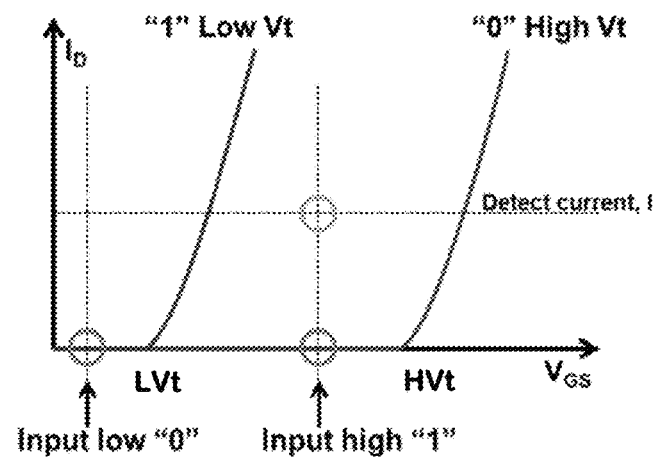

FIG. 11A shows a circuit schematic of a single programmable resistance cell. FIG. 11B provides an IV curve (a current versus voltage plot) by which operation of the cell in a one bit per cell, binary mode can be understood. The cell as current carrying nodes 600 and 601. An input node 602 is connected to the gate of a programmable transistor as discussed above. The resistance of the parallel resistor in the cell is set at a value $R_{mn}$, where m corresponds to the row of the cell, and n corresponds to the column of the cell.

The graph in FIG. 11B shows two voltage versus current traces. The first voltage versus current trace corresponds to a "1" cell weight $w_{mn}$ in which the cell has a low threshold Low Vt. The second trace corresponds to a "0" cell weight $w_{mn}$ in which the cell has a high threshold High Vt. When the input value is low, so that the Low Vt is greater than the input voltage, the transistor in the cell is off and conducts very low current for either binary weight of the cell. When the input value is high, so that the Low Vt is less than the input voltage, and the input voltage is less than the High Vt, then the transistor in the cell is on if the weight is "1" corresponding to a Low Vt cell, and the transistor is off if the weight is "0" corresponding to a High Vt cell.

When the transistor is off, a larger voltage drop $V_{dLg}$ dominated by the voltage drop caused by current through the resistor $I*R_{mn}$ is induced. When the transistor is on, a smaller voltage drop $V_{dSm}$ which can be considered to be close to 0 V, dominated by the voltage drop caused by current through the transistor channel, is induced. This relationship is illustrated in the following TABLE 1.

TABLE 1

| $V_n$ (voltage drop) | Weight $W_{mn}$ | |
| --- | --- | --- |
| Transistor state | "0" High Vt (HVt) | "1" Low Vt (LVt) |
| "1" High: HVt > Input > LVt | OFF, (I*R, $V_{dLg}$) | ON, (~0, $V_{dSm}$) |
| "0" Low: LVt > Input | OFF, (I*R, $V_{dLg}$) | OFF, (I*R, $V_{dLg}$) |

Figure 12:
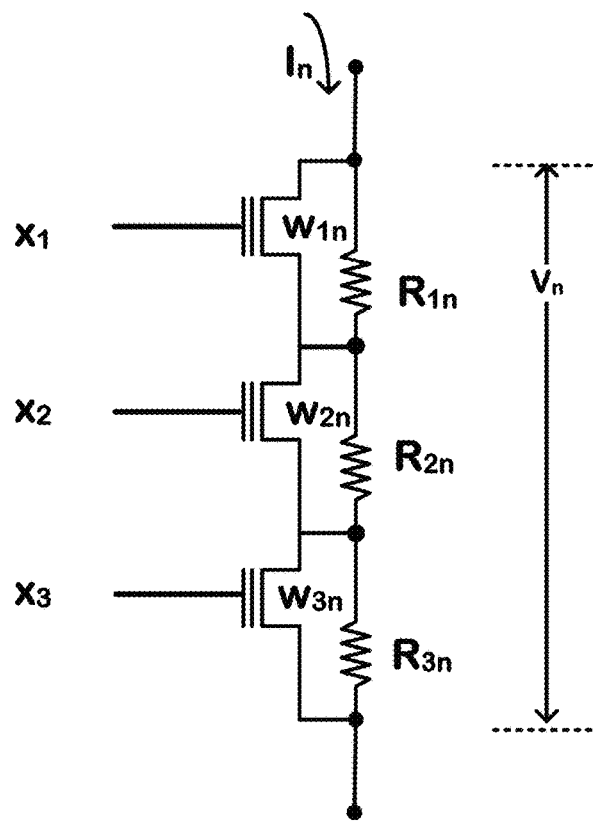
FIG. 12 illustrates a string of variable resistance cells configured for implementation of a sum-of-products operation.

The binary operation can be extended to a string of variable resistance cells as illustrated in FIG. 12. In FIG. 12, three cells are illustrated on a single string in a column n of the array. The column receives a constant current $I_n$ and input values $X_1$ to $X_3$ on respective rows. The voltage drop in the column depends on the weights $W_{1n}$, $W_{2n}$ and $W_{3n}$ of the individual cells in the column, and the input values. This example uses three individual cells to implement three terms $X_iW_i$ for i going from 1 to 3 of a sum-of-products operation, to generate a voltage $V_n$ representing the sum.

With three input variables, shown in the first column, and three potential weights, shown across the second row of the table, and assuming a constant current and constant resistor value for each of the cells, the variations on the voltage drop $V_n$ on the column can be seen (assuming $V_{dSm}$ is close to ("~") zero) in the following TABLE 2.

TABLE 2

| $V_n$ Input | Weight [$W1_n$, $W2_n$, $W3_n$] | | | | | | | |
|---|---|---|---|---|---|---|---|---|
| [x1 x2 x3] | [000] | [001] | [010] | [011] | [100] | [101] | [110] | [111] |
| [000] | $3V_{dLg}$ | $3V_{dLg}$ | $3V_{dLg}$ | $3V_{dLg}$ | $3V_{dLg}$ | $3V_{dLg}$ | $3V_{dLg}$ | $3V_{dLg}$ |
| [001] | $3V_{dLg}$ | $\sim 2V_{dLg}$ | $3V_{dLg}$ | $\sim 2V_{dLg}$ | $3V_{dLg}$ | $\sim 2V_{dLg}$ | $3V_{dLg}$ | $\sim 2V_{dLg}$ |
| [010] | $3V_{dLg}$ | $3V_{dLg}$ | $\sim 2V_{dLg}$ | $\sim 2V_{dLg}$ | $3V_{dLg}$ | $3V_{dLg}$ | $\sim$ | $\sim 2V_{dLg}$ |
| [011] | $3V_{dLg}$ | $\sim 2V_{dLg}$ | $\sim 2V_{dLg}$ | $\sim V_{dLg}$ | $3V_{dLg}$ | $\sim$ | $2V_{dLg}$ | $\sim V_{dLg}$ |
| [100] | $3V_{dLg}$ | $3V_{dLg}$ | $3V_{dLg}$ | $3V_{dLg}$ | $\sim 2V_{dLg}$ | $\sim 2V_{dLg}$ | $\sim$ | $\sim 2V_{dLg}$ |
| [101] | $3V_{dLg}$ | $\sim 2V_{dLg}$ | $3V_{dLg}$ | $\sim 2V_{dLg}$ | $\sim 2V_{dLg}$ | $\sim V_{dLg}$ | $2V_{dLg}$ | $\sim V_{dLg}$ |
| [110] | $3V_{dLg}$ | $3V_{dLg}$ | $\sim 2V_{dLg}$ | $\sim 2V_{dLg}$ | $\sim 2V_{dLg}$ | $\sim 2V_{dLg}$ | $\sim V_{dLg}$ | $\sim V_{dLg}$ |
| [111] | $3V_{dLg}$ | $\sim 2V_{dLg}$ | $\sim 2V_{dLg}$ | $\sim V_{dLg}$ | $\sim 2V_{dLg}$ | $\sim V_{dLg}$ | $\sim V_{dLg}$ | $\sim 0$ |

By setting the sensing reference voltages according to these four levels of $V_n$, the voltage across the columns can be translated into numerical outputs between 0 and 3, as shown in the following TABLE 3.

TABLE 3

| Voltage drop ($3-V_n/V_{dLg}$) | Weight [$W1_n$, $W2_n$, $W3_n$] | | | | | | | |
|---|---|---|---|---|---|---|---|---|
| Input [x1 x2 x3] | [000] | [001] | [010] | [011] | [100] | [101] | [110] | [111] |
| [000] | 0 | 0 | 0 | 0 | 0 | 0 | 0 | 0 |
| [001] | 0 | 1 | 0 | 1 | 0 | 1 | 0 | 1 |
| [010] | 0 | 0 | 1 | 1 | 0 | 0 | 1 | 1 |
| [011] | 0 | 1 | 1 | 2 | 0 | 1 | 1 | 2 |
| [100] | 0 | 0 | 0 | 0 | 1 | 1 | 1 | 1 |
| [101] | 0 | 1 | 0 | 1 | 1 | 2 | 1 | 2 |
| [110] | 0 | 0 | 1 | 1 | 1 | 1 | 2 | 2 |
| [111] | 0 | 1 | 1 | 2 | 1 | 2 | 2 | 3 |

As the number of rows providing unique inputs and number of columns of cells increases, the array can generate complex sum-of-products while relying on "binary" operation (i.e., programming the transistors to a low threshold or a high threshold) of the individual programmable resistance cells.

In some embodiments, multibit binary weights may be stored in some or all of the cells in the array, adding further resolution to programmable weights of the cells.

Figure 13:
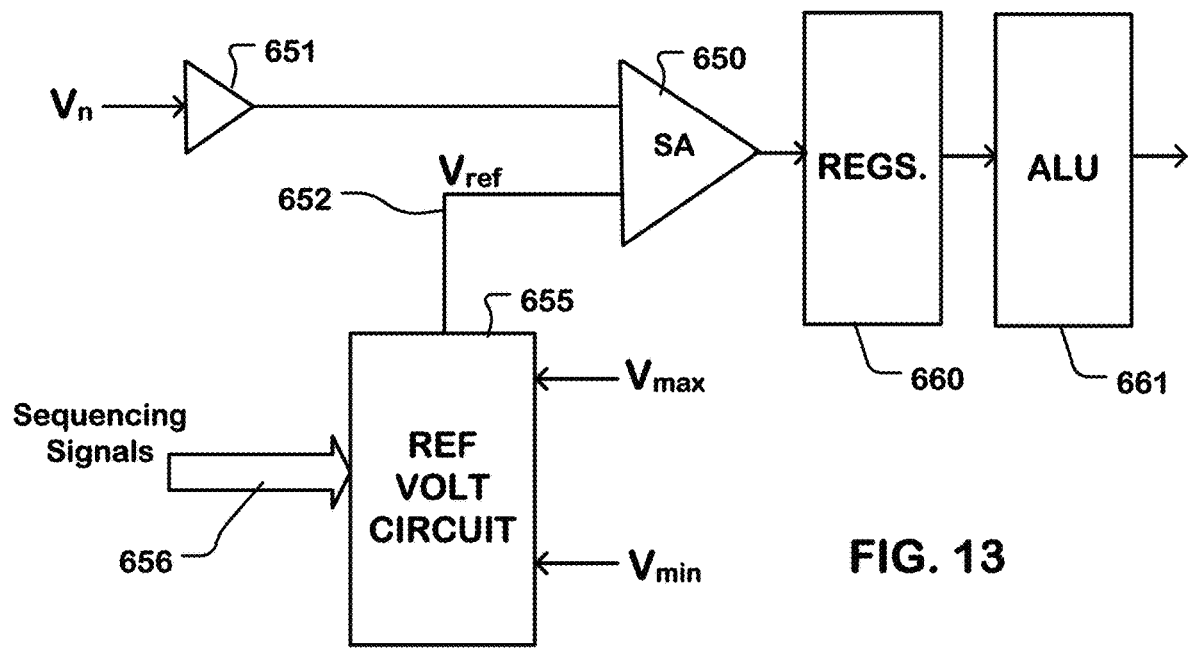
FIG. 13 is a simplified block diagram of sensing circuitry that can be utilized with an array of variable resistance cells for the purposes of sum-of-products operations.

FIG. 13 is a block diagram of sensing circuitry that can be utilized with an array of variable resistance cells configured for sum-of-products operation, with voltage sensing as described above. Sensing circuitry in this example includes a sense amplifier 650 implemented for example using an operational amplifier or other type of comparator. The inputs to the sense amplifier 650 include the voltage $v_n$ and a reference voltage $V_{ref}$ on line 652. The voltage $v_n$ is developed on a selected column, and can be delivered through a buffer 651. The buffer 651 can be implemented for example using a unity gain configured operational amplifier or other voltage to voltage amplifier. The reference voltage $V_{ref}$ on line 652 is provided by a reference voltage circuit 655, which is configured to sequence through a set of reference voltages corresponding to each of the voltage levels to be distinguished by the sense amplifier 650 in response to sequencing signals on line 656. The reference voltage circuit 655 can receive input voltages $V_{max}$ and $V_{min}$ which can determine minimum and maximum voltages to be developed on line 652 as the reference voltage $V_{ref}$.

Figure 13A:
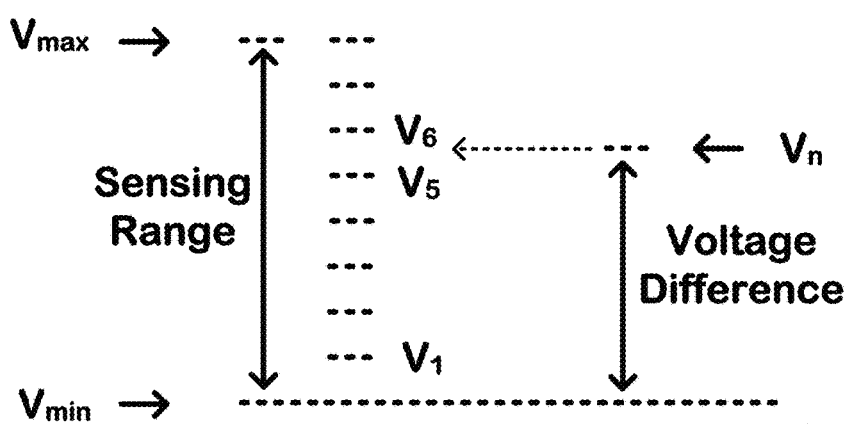
FIG. 13A is a heuristic diagram referred to for the purposes of describing the sensing operations using the circuit of FIG. 13.

FIG. 13A is a chart that illustrates heuristically the sensing operation. Given voltages $V_{max}$ and $V_{min}$, circuitry of FIG. 14 can generate reference voltages at a plurality of levels within a sensing range as indicated by the chart. The voltage $V_n$ developed on a selected column in the array can fall at a level within the sensing range that has a voltage difference above the voltage $V_{min}$. The sensing circuitry determines a level for the voltage $V_n$, which in this case is higher than each of the reference voltages $V_1$ to $V_5$ and lower than the reference voltage $V_6$. It can therefore assign a digital value to the voltage $V_n$ corresponding to the reference voltage $V_6$.

The output of the sense amplifier 650 comprises a sequence of signals that correspond with the input reference voltage level. These signals can be stored in registers 660, that are provided to an arithmetic logic unit 661 or other type of processing circuitry like a digital signal processor, general purpose processor, or the like, where further arithmetic operations can be executed to further the sum-of-products operations. For example, the outputs generated on a plurality of columns of the array can be combined for the purposes of generating a single term of the sum-of-products operation, depending on how the array of programmable resistance cells configured as discussed below.

Figure 14:
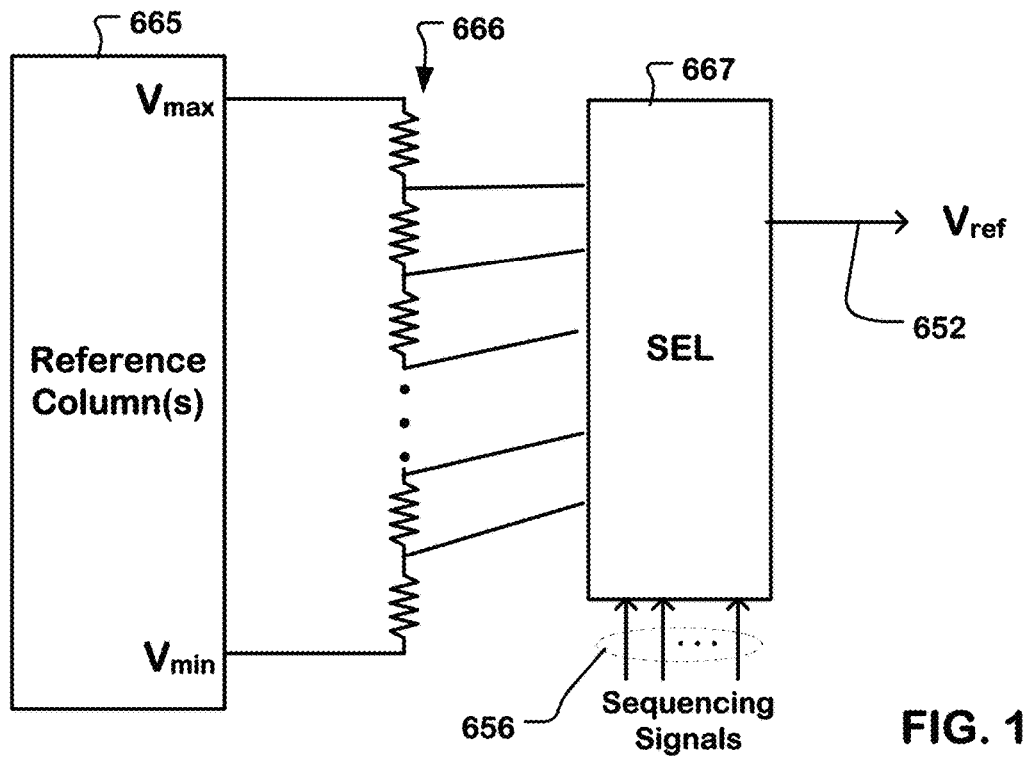
FIG. 14 is a simplified diagram of a reference voltage circuit that can be utilized with sensing circuitry like that of FIG. 13.

FIG. 14 is a block diagram of a reference voltage circuit which can be utilized with a sense amplifier arrangement like that of FIG. 13. In the diagram of FIG. 14, a reference column or reference columns 665 in the array of programmable resistance cells, or using cell structures like those used in the array, can be arranged to provide one or both of the voltages $V_{max}$ and $V_{min}$. Voltages $V_{max}$ and $V_{min}$ this example are applied to a resistive voltage divider 666, which produces a plurality of reference voltage levels at nodes between the resistors in the divider 666. The nodes responding to the reference voltage levels are coupled to a selector 667. The selector 667 is responsive to the sequencing signals on line 656 to provide a sequence of reference voltages $V_{ref}$ on line 652, coupled to the sense amplifier 650 in the configuration of FIG. 13.

Figure 15:
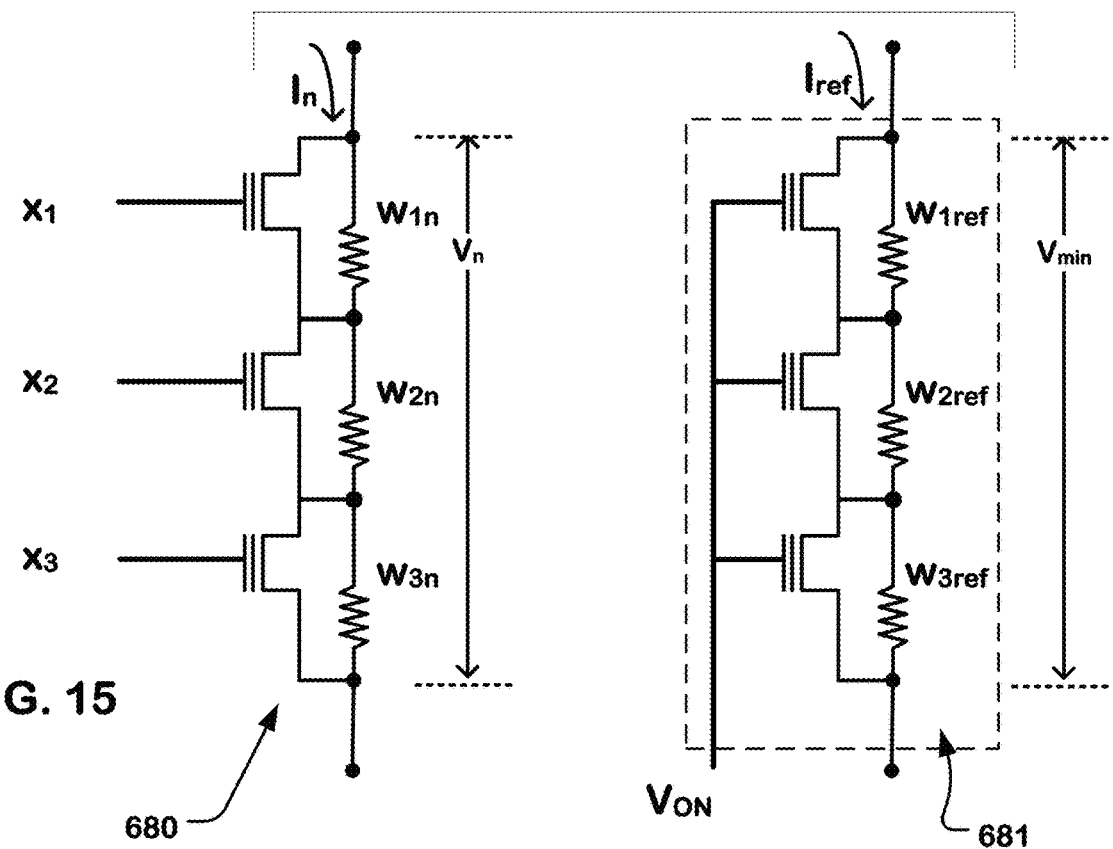
FIG. 15 illustrates a configuration of an array of variable resistance cells, including a reference string.

FIG. 15 illustrates one configuration of a reference column configured for the purposes of generating voltage $V_{min}$ that can be used as described with reference to FIGS. 13 and 14 for the purposes of generating the reference voltages used in the sensing circuitry. In the example, a three cell operating string 680 on column n is configured for a sum-of-products operation, where the cells have inputs $X_1$ to $X_3$ and weights $W_{1n}$, $W_{2n}$ and $W_{3n}$. The weights are programmed into the operating string 680 according to the terms of the sum-of-products operation to be executed. The voltage generated by a current $I_n$ through the string is designated $V_n$.

Reference string 681 column is implemented in the array, using three cells that can have electrical characteristics matching those of the three cells used in the operating string 680. In order to generate the voltage $V_{min}$, the weights of the cells in the reference string 681, designated $W_{1ref}$, $W_{2ref}$ and $W_{3ref}$, are all set to the value (in this case "1") of corresponding to the low threshold state. The resistors in the cells of the reference string 681 can have a constant value R that matches the value R in the cells in the operating string 680. The inputs to the cells in the reference string 681 are tied together and coupled to a voltage $V_{ON}$ during operation so that all the cells in the reference string 681 are turned on, and generate the small voltage drop $V_{dSm}$. Thus the voltage $V_{min}$ in this example will be equal to about $3*V_{dSm}$, or three times the small voltage drop of the unit cell used in the operating string 680. TABLE 4 below illustrates an operating example for a given input and weight configuration for the operating string (computation column) and the reference column.

TABLE 4

| Computation column | | | Reference column | | Voltage | |
|---|---|---|---|---|---|---|
| Input | Weight | Voltage drop | Input/ Weight | Voltage drop | difference for each bit | |
| x1 | $W_{1n}$ | 1 | $V_{dSm}$ | 1/1 | $V_{dSm}$ | $V_{dSm} - V_{dSm} = 0$ |
| x2 | $W_{2n}$ | 1 | $V_{dLg}$ | 1/1 | $V_{dSm}$ | $V_{dLg} - V_{dSm} = V_d$ |
| x3 | $W_{3n}$ | 0 | $V_{dLg}$ | 1/1 | $V_{dSm}$ | $V_{dLg} - V_{dSm} = V_d$ |

In an embodiment in which a reference string is used to generate only $V_{min}$, the value $V_{max}$ used by the reference voltage circuitry can be set at a high enough value to provide a good operating margin for the device. The example shown in FIG. 15 is based on a string including three variable resistance cells.

In embodiments of the present technology, the variable resistance cells can be implemented in large-scale arrays using NAND-like technologies. Thus, any given column of cells that is coupled in a string can have, for example, 16, 32, 64 or more cells. In the configuration of any given sum-of-products operation, less than all of the cells in a given column may be utilized.

Figure 16:
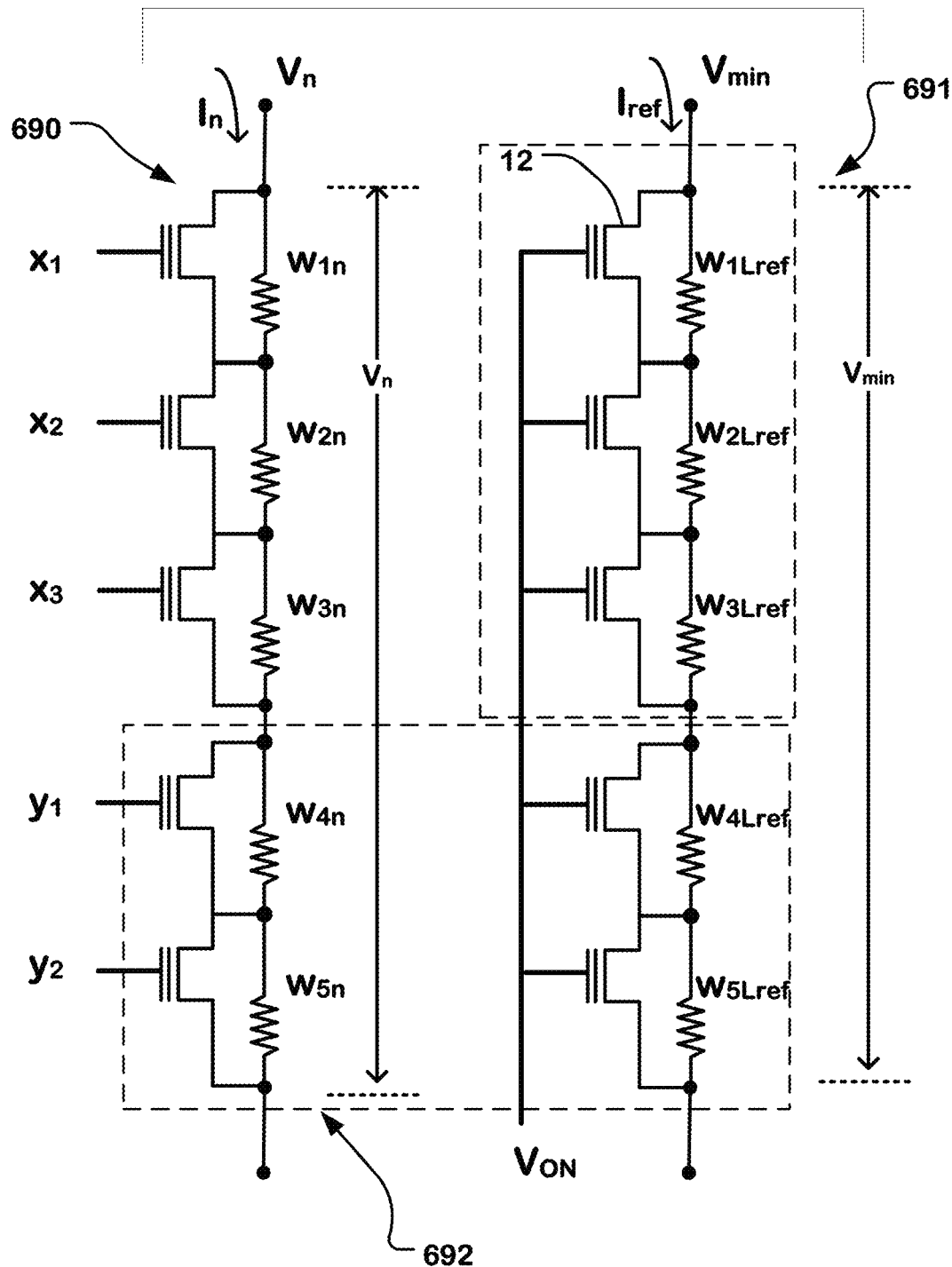
FIG. 16 illustrates another configuration of an array of variable resistance cells, including a reference string and unused cells.

FIG. 16 illustrates an example configuration including operating string 690 in operating column n and a reference string 691 in a reference column with a plurality of unused cells in region 692 on the operating and reference columns. The reference column in this example is configured for the purposes of generating voltage $V_{min}$ that can be used as described with reference to FIGS. 13 and 14 for the purposes of generating the reference voltages used in the sensing circuitry.

In the example shown, a three cell operating string 690 on the operating column n is configured for a sum-of-products operation, where the cells on the operating string 690 have inputs $X_1$ to $X_3$ and weights $W1_n$, $W2_n$ and $W3_n$. The weights are programmed into the operating string 690 according to the terms of the sum-of-products operation to be executed. Unused cells on the operating column n are given inputs $Y_1$ and $Y_2$ and weights $W4_n$ and $W5_n$. The voltage generated by a current $I_n$ through the string is designated $V_n$. The inputs $Y_1$ and $Y_2$ and weights $W4_n$ and $W5_n$ are configured so that the unused cells in the operating column n are turned on during the sum-of-products operation.

Reference string 691 is implemented in the array or in a reference array, in a reference column using three cells that can have electrical characteristics matching those of the three cells used in the operating string 690. Unused cells on the reference column including the reference string 691 have weights $W4_{ref}$ and $W5_{ref}$. In order to generate the voltage $V_{min}$, the weights of the cells in the reference string 691, designated $W1_{ref}$, $W2_{ref}$ and $W3_{ref}$ and of the cells having weights $W4_{ref}$ and $W5_{ref}$ in the unused part of the column, are all set to the value (in this case "1") of corresponding to the low threshold state. The resistors in the cells of the reference string 691 in the unused part of the column in region 692 can have a constant value R that matches the value R in the cells in the operating string 690 and the value R of the cells in the region 692 in the same column is the operating string 690. The inputs to the cells in the reference string 691 including the unused cells are tied together and coupled to a voltage $V_{ON}$ during operation so that all the cells in the column including the reference string 691 are turned on, and generate the small voltage drop $V_{dSm}$. Thus the voltage $V_{min}$ in this example with five cells in the string, will be equal to about $5*V_{dSm}$, or five times the small voltage drop of the unit cell used in the operating string 680. With more cells in the string, the value of $V_{min}$ will be shifted accordingly.

TABLE 5 below illustrates an operating example for a given input and weight configuration for the operating string (computation column) and the reference column, for the configuration of FIG. 16.

TABLE 5

| Computation column | | | Reference column | | Voltage | |
|---|---|---|---|---|---|---|
| Input | Weight | Voltage drop | Input/ Weight | Voltage drop | difference for each bit | |
| X1 | $W_{1n}$ | 1 | $V_{dSm}$ | 1/1 | $V_{dSm}$ | $V_{dSm} - V_{dSm} = 0$ |
| X2 | $W_{2n}$ | 0 | $V_{dLg}$ | 1/1 | $V_{dSm}$ | $V_{dLg} - V_{dSm} = V_d$ |
| X3 | $W_{3n}$ | 0 | $V_{dLg}$ | 1/1 | $V_{dSm}$ | $V_{dLg} - V_{dSm} = V_d$ |
| Y1 | $Wy_{1n}$ | 1 | $V_{dSm}$ | 1/1 | $V_{dSm}$ | $V_{dSm} - V_{dSm} = 0$ |
| Y2 | $Wy_{2n}$ | 1 | $V_{dSm}$ | 1/1 | $V_{dSm}$ | $V_{dSm} - V_{dSm} = 0$ |

Figure 17:
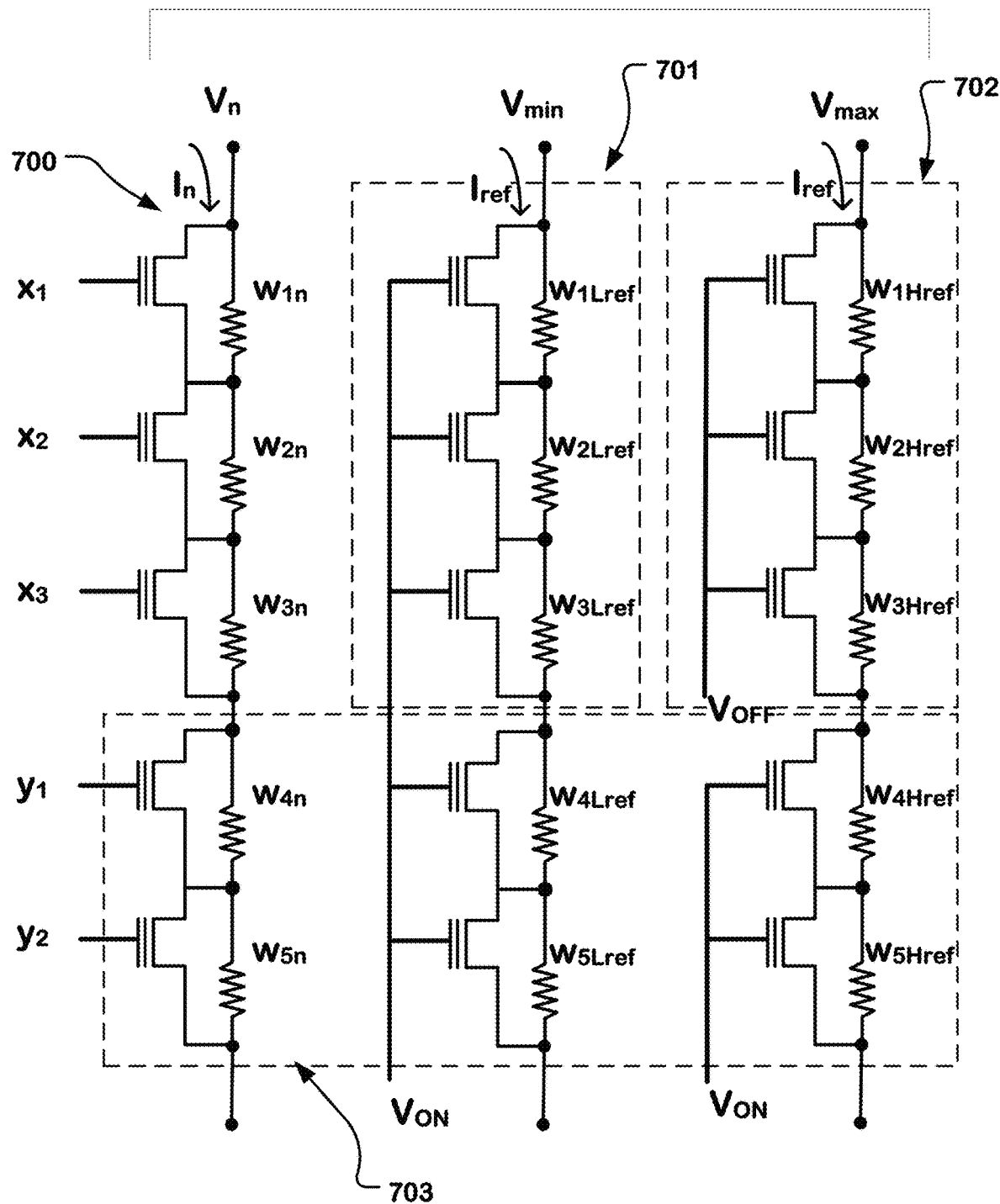
FIG. 17 illustrates another configuration of an array of variable resistance cells including two reference strings and unused cells.

FIG. 17 illustrates an example configuration in which both the voltages $V_{min}$ and $V_{max}$ are generated. In this configuration, an operating string 700 in an operating column n includes three cells as in the examples of FIG. 15 and FIG. 16. Thus, the operating column n is configured for a sum-of-products operation, where the cells in the operating string 700 have inputs X1 to X3 and weights $W1_n$, $W2_n$ and $W3_n$. The weights are programmed into the operating string 700 according to the terms of the sum-of-products operation to be executed. Unused cells on the operating column n are given inputs Y1 and Y2 and weights $W4_n$ and $W5_n$. The voltage generated by a current $I_n$ through the string is designated $V_n$. The inputs Y1 and Y2 and weights $W4_n$ and $W5_n$ are configured so that the unused cells in the operating column n are turned on during the sum-of-products operation.

A $V_{min}$ reference column includes a reference string 701 and unused cells in the region 703 of the array. The reference string 701 includes three cells that can have electrical characteristics matching those of the three cells used in the operating string 700. Unused cells on the $V_{min}$ reference column include the reference string 691 weights $W4_{Lref}$ and $W5_{Lref}$. In order to generate the voltage $V_{min}$, the weights of the cells in the reference string 701, designated $W1_{Lref}$, $W2_{Lref}$ and $W3_{Lref}$ and of the unused cells in the $V_{min}$ column having weights $W4_{Lref}$ and $W5_{Lref}$ in the unused part of the column, are all set to the value (in this case "1") corresponding to the low threshold state. The resistors in the cells of the reference string 701 and in the unused part of the column can have a constant value R that matches the value R in the cells in the operating string 700 and the value R of the cells in the region 703 in the operating column n. The inputs to the cells in the $V_{min}$ reference column including reference string 701 and the unused cells are tied together and coupled to a voltage $V_{ON}$ during operation so that the transistors in all the cells in the $V_{min}$ reference column including the reference string 701 are turned on, and assuming $I_{ref}$ is equal to $I_n$, generate the small voltage drop $V_{dSm}$. Thus, the voltage $V_{min}$ in this example with five cells in the string, will be equal to about $5*V_{dSm}$, or five times the small voltage drop of the unit cell used in the operating string 700. With more cells in the string, the value of $V_{min}$ will be shifted accordingly.

A $V_{max}$ reference column includes a reference string 702 and unused cells in the region 703 of the array. The reference string 702 includes three cells that can have electrical characteristics matching those of the three cells used in the operating string 700. Unused cells on the $V_{max}$ reference column including the reference string 702 have weights $W4_{Href}$ and $W5_{Href}$. In order to generate the voltage $V_{max}$, the weights of the cells in the reference string 702, designated $W1H_{ref}$, $W2_{Href}$ and $W3_{Href}$ and of the unused cells in the $V_{min}$ column having weights $W4_{Href}$ and $W5_{Href}$ in the unused part of the $V_{max}$ reference column, are all set to the value (in this case "0") corresponding to the high threshold state. The resistors in the cells of the reference string 701 and in the unused part of the column can have a constant value R that matches the value R in the cells in the operating string 700 and the value R of the cells in the region 703 in the operating column n. The inputs to the cells in the $V_{max}$ reference column including string 702 are tied together and coupled to a voltage $V_{OFF}$ during operation, and the unused cells are coupled to the voltage $V_{ON}$, so that the transistors in three cells in the column including the $V_{max}$ reference string 701 are turned off, and assuming $I_{ref}$ is equal to $I_n$, generate the large voltage drop $V_{dLg}$. Thus, the voltage $V_{max}$ in this example with five cells in the string, will be equal to about $3*V_{dLg}$, or three times the large voltage drop of the unit cell used in the operating string 700. With more cells in the string, the value of $V_{max}$ will be shifted accordingly.

TABLE 6 below illustrates an operating example for a given input and weight configuration for the operating string (computation column) and the reference column, for the configuration of FIG. 17.

multiple bit binary value, using a single bit value programmed in the programmable transistors in the cells.

FIGS. 18-22 illustrate some example configurations of functional sets that implement multiple bit binary values.

Figure 18:
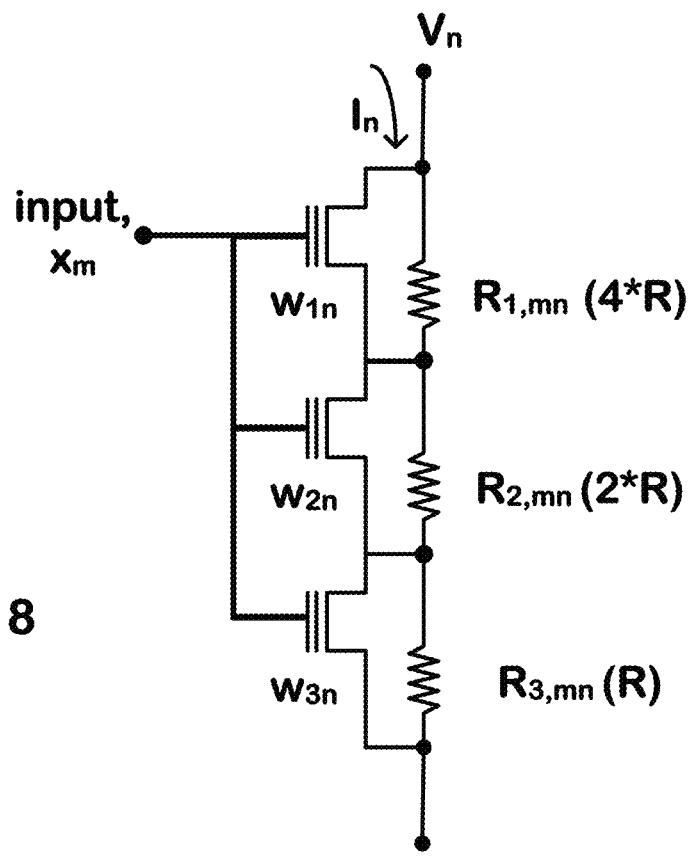
FIGS. 18-22 illustrates functional sets of variable resistance cells configured to implement terms of sum-of-products operations with multiple bit weights.

FIG. 18 illustrates a functional set including three member cells on a single string in a column n of the array. The column receives a constant current $I_n$. Input value $X_m$ is connected to the gates of the transistors in the cells in all three rows. In this example, the resistances of the resistors $R_{1,mn}$, $R_{2,mn}$ and $R_{3,mn}$ in the three cells in the set are different. Thus the resistor R3 has a resistance R, the resistor R2 has a resistance $2*R$, and the resistor R1 has a resistance $4*R$. Thus, the weight of the functional set has a three bit binary value, ranging from 0 to 7, based on combinations making the effective resistance vary from $0*R$ (all transistors in the functional set on) to $7*R$ (all transistors in the functional set off). The term of the sum-of-products operation implemented using the functional set of FIG. 18 can be characterized as $X_m(W1*4R+W2*2R+W3*R)$. In other embodiments, a function set of cells in the array like that of FIG. 18 can have more than three members connected in a column with a common input $X_m$.

An array of cells as discussed above can be configured using logic circuits to implement terms of a sum-of-products operation using many functional sets configured to implement many forms of the terms of the operation.

Figure 19:
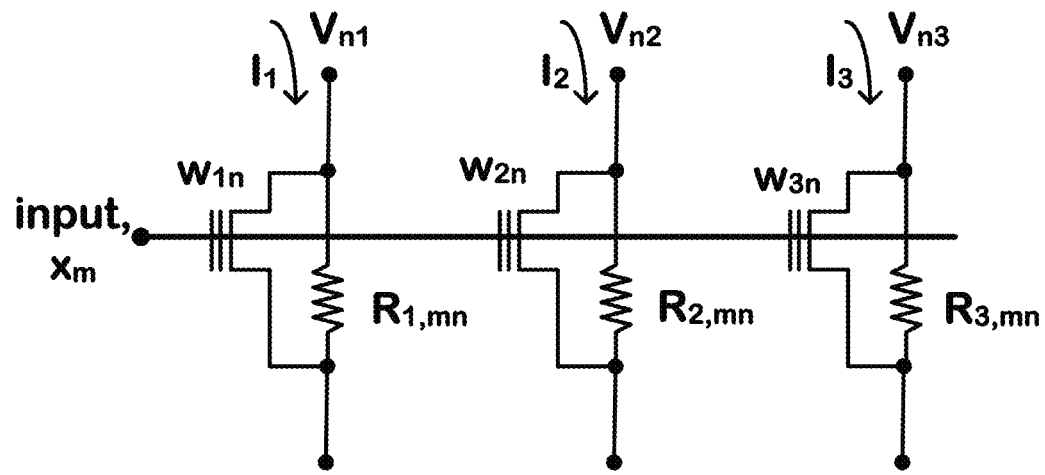

FIG. 19 illustrates a functional set including three member cells in one row of the array on three different columns n1, n2 and n3 of the array. Each of the three columns receives a constant current In. Input value $X_m$ is connected to the gates of the transistors in the cells in the row. In this example, the resistances of the resistors $R_{1,mn}$, $R_{2,mn}$ and $R_{3,mn}$ in the three cells in the set are different. Thus the resistor R3 has a resistance R, the resistor R2 has a resistance $2*R$, and the resistor R1 has a resistance $4*R$. The voltage generated in each of the column $V_{n1}$, $V_{n2}$ and $V_{n3}$ are summed in peripheral circuitry to provide the sum output of the term.

TABLE 6

| Computation column ($V_n$) | | | Reference column, Low boundary ($V_{min}$) | | Reference column, High boundary ($V_{max}$) | | Voltage |
|---|---|---|---|---|---|---|---|
| Input | Weight | Voltage drop | Input/ Weight | Voltage drop | Input/ Weight | Voltage drop | difference for each bit |
| X1 | 1 | $W_{1n}$ 1 | $V_{dSm}$ | 1/1 | $V_{dSm}$ | 1/0 | $V_{dSm}$ | $V_{dSm} - V_{dSm} = 0$ |
| X2 | 0 | $W_{2n}$ 1 | $V_{dLg}$ | 1/1 | $V_{dSm}$ | 1/0 | $V_{dLg}$ | $V_{dLg} - V_{dSm} = V_d$ |
| X3 | 1 | $W_{3n}$ 0 | $V_{dLg}$ | 1/1 | $V_{dSm}$ | 1/0 | $V_{dLg}$ | $V_{dLg} - V_{dSm} = V_d$ |
| Y1 | 1 | $W_{4n}$ 1 | $V_{dSm}$ | 1/1 | $V_{dSm}$ | 1/1 | $V_{dSm}$ | $V_{dSm} - V_{dSm} = 0$ |
| Y2 | 1 | $W_{5n}$ 1 | $V_{dSm}$ | 1/1 | $V_{dSm}$ | 1/1 | $V_{dSm}$ | $V_{dSm} - V_{dSm} = 0$ |

In the embodiments described with reference to FIGS. 12 and 15-17, the array of programmable resistance cells is configured into functional sets that have one input $X_i$, and include one member cell, each cell in the operating column implementing a term $X_iW_i$ having one bit binary weight $W_i$, that is determined by the threshold of the programmable threshold transistor in the cell. The resistance R of the resistors in the cell, and the current $I_n$ in the string are constants.

In some embodiments, the array of programmable resistance cells can be configured into functional sets having one input and multiple members to implement a term $X_iW_i$ of the sum-of-products operation in which the weight $W_i$ can be values other than a one bit binary "0" or "1", such as a The term of the sum-of-products operation implemented using the functional set of FIG. 19 can be characterized as $X_m(W1*I4R+W2*I2R+W3*IR)$, with each column producing a voltage representing one part of the term. Thus, the weight of the functional set has a three bit binary value, ranging from 0 to 7, based on combinations making the voltage vary from $0*IR$ (all transistors in the functional set on) to $7*IR$ (all transistors in the functional set off).

Peripheral circuitry configured to perform the sum can include analog summing amplifiers or digital logic. In one example, the voltage on each column can be sensed in sequence, and the results of each sensing step added in arithmetic logic as illustrated in FIG. 13 for example.

In other embodiments, a function set of cells in the array like that of FIG. 19 can have more than three members connected in a column with a common input $X_m$.

Figure 20:
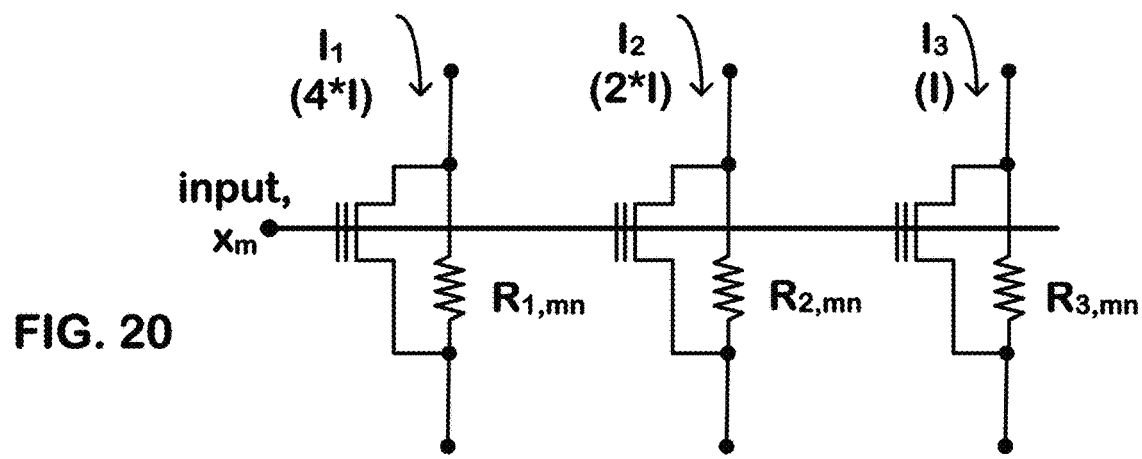

FIG. 20 illustrates a functional set including three member cells in one row of the array on three different columns n1, n2 and n3 of the array. Input value $X_m$ is connected to the gates of the transistors in the cells in the row. In this example, the resistances of the resistors $R_{1,mn}$, $R_{2,mn}$ and $R_{3,mn}$ in the three cells in the set are the same. Each of the three columns receives a different constant current $I_n$. Thus a current source provides $I_3$ to column 3 with a current I, a current source provides $I_2$ to column 2 with a current 2*I, and a current source provides $I_1$ to column 1 with a current 4*I. The voltages $V_{n1}$, $V_{n2}$ and $V_{n3}$ generated in the columns of the functional set are summed in peripheral circuitry to provide the sum output of the term. Thus, the weight of the functional set has a three bit binary value, ranging from 0 to 7, based on combinations making the output values vary from 0*IR (all transistors in the functional set on) to 7*IR (all transistors in the functional set off).

The term of the sum-of-products operation implemented using the functional set of FIG. 20 can be characterized as $X_m$(W1*4IR+W2*2IR+W3*IR), with each column producing a voltage representing one part of the term.

Peripheral circuitry configured to perform the sum can include analog summing amplifiers or digital logic. In one example, the voltage on each column can be sensed in sequence, and the results of each sensing step added in arithmetic logic as illustrated in FIG. 13 for example.

In other embodiments, a function set of cells in the array like that of FIG. 20 can have more than three members connected in a column with a common input $X_m$.

Figure 21:
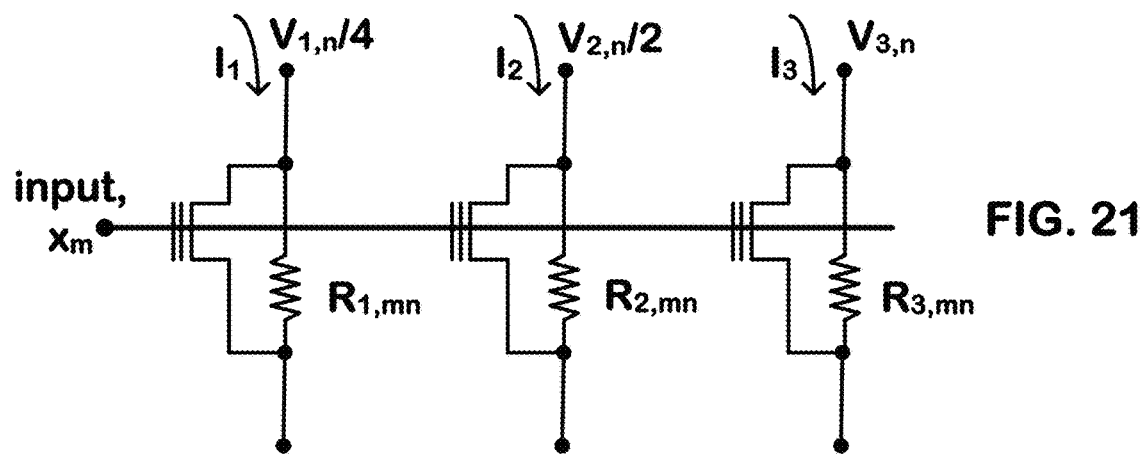

FIG. 21 illustrates a functional set including three member cells in one row of the array on three different columns n1, n2 and n3 of the array. Input value $X_m$ is connected to the gates of the transistors in the cells in the row. In this example, the resistances of the resistors $R_{1,mn}$, $R_{2,mn}$ and $R_{3,mn}$ in the three cells in the set are the same. Each of the three columns receives a same constant current $I_n$. The voltages $V_{n1}$, $V_{n2}$ and $V_{n3}$ generated in the columns of the functional set divided by 4, 2 and 1, respectively, and then summed in peripheral circuitry to provide the sum output of the term. Thus, the weight of the functional set has a three bit binary value, ranging from 0 to 7, based on combinations making the output values vary from 0*IR (all transistors in the functional set on) to 7*IR (all transistors in the functional set off).

The term of the sum-of-products operation implemented using the functional set of FIG. 21 can be characterized as $X_m$(W1*4IR+W2*2IR+W3*IR), with each column producing a voltage that is divided in peripheral circuit to represent one part of the term.

Peripheral circuitry configured to perform the sum can include analog summing amplifiers or digital logic. In one example, the voltage on each column can be sensed in sequence, and the results of each sensing step added in arithmetic logic as illustrated in FIG. 13 for example.

In other embodiments, a function set of cells in the array like that of FIG. 21 can have more than three members connected in a column with a common input $X_m$.

Figure 22:
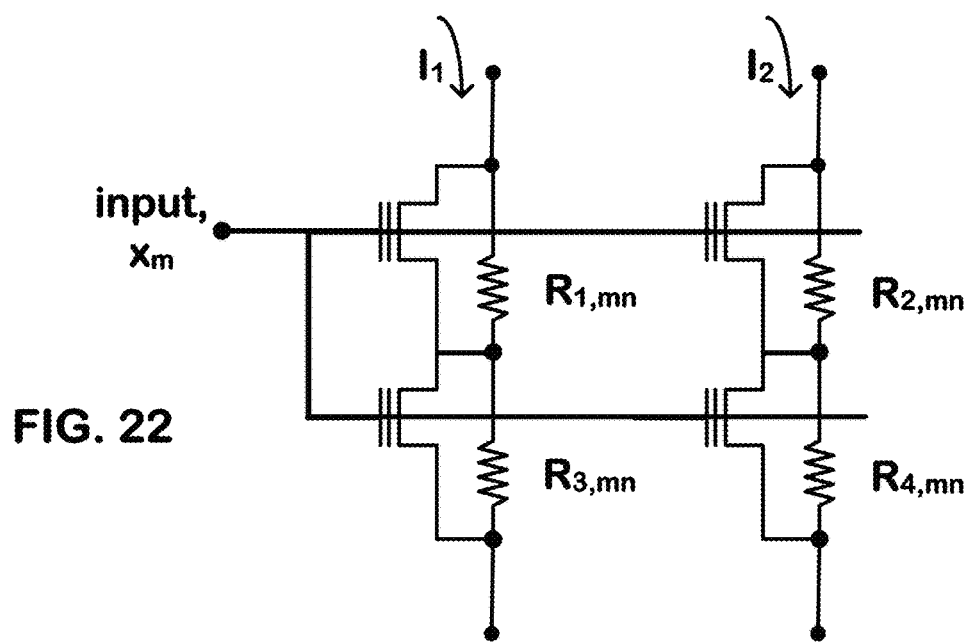

FIG. 22 illustrates a functional set including four member cells, including two cells in one row of the array and two cells in a second row of the array, on two different columns n1 and n2 of the array. Input value $X_m$ is connected to the gates of the transistors in all cells in both rows of the functional set. In this example, the resistances of the resistors $R_{1,mn}$, $R_{2,mn}$, $R_{3,mn}$ and $R_{4,mn}$ in the four cells in the set are different. Thus the resistors R3 and R4 have resistance R, the resistors R1 and R2 have resistance 4*R. Each of the two columns receives a different constant current $I_n$. Thus, a current source provides $I_2$ to column 2 with a current I, a current source provides $I_1$ to column 1 with a current 2*I. The voltages $V_{n1}$ and $V_{n2}$ generated in the two columns of the functional set are summed in peripheral circuitry to provide the sum output of the term.

The term of the sum-of-products operation implemented using the functional set of FIG. 22 can be characterized as $X_m$(W1*2I*4R+W2*I*4R+W3*2I*R+W4*I*R), with each column producing a voltage representing one part of the term. Thus, the weight of the functional set has a four bit binary value, ranging from 0 to 15, based on combinations making the output values vary from 0*IR (all transistors in the functional set on) to 15*IR (all transistors in the functional set off).

Peripheral circuitry configured to perform the sum can include analog summing amplifiers or digital logic. In one example, the voltage on each column can be sensed in sequence, and the results of each sensing step added in arithmetic logic as illustrated in FIG. 13 for example.

In other embodiments, a function set of cells in the array like that of FIG. 22 can have more than three members connected in a column with a common input $X_m$.

Other functional set configurations can be utilized as well.

A large array of programmable resistance cells can be configured between operations to perform complex sum-of-products operations with various functions for the terms of the summation, as needed for each computation executed. Also, the coefficients (i.e. weights) of the terms of the summation can set in nonvolatile form in the transistors in the cells, and changed by programming and erasing operations as needed for each computation executed.

Figure 23:
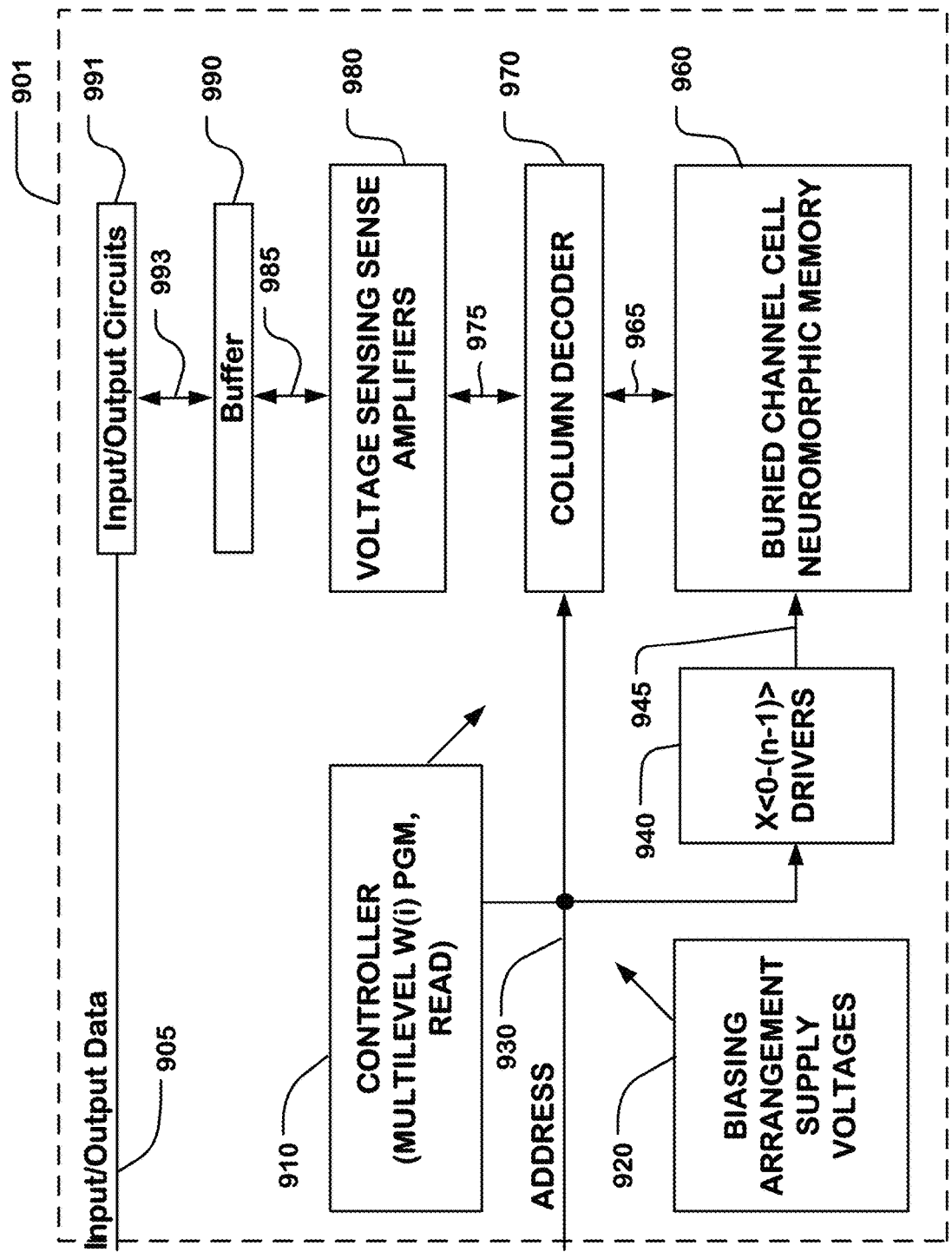
FIG. 23 is a simplified block diagram of a device including an array of variable resistance cells applied, for example, for neuromorphic memory.

FIG. 23 is a simplified chip block diagram of an integrated circuit 901 including a sum-of-products array with voltage sensing, and buried channel cells such as illustrated in FIGS. 5 and 6 and FIG. 10A/10B, configured as a neuromorphic memory array 960.

A word line driver 940 is coupled to a plurality of word lines 945. The driver comprises, for example, digital-to-analog converters in some embodiments that produce an input variable x(i) for each selected word line, or in the alternative a binary word line driver can be apply binary inputs. A column decoder 970 is coupled via lines 965 to one or more layers of strings of series-connected cells arranged along columns in the array 960 for selecting strings for reading sum-of-products data from and writing parameter data to the memory array 960. Addresses are supplied on bus 930 from control logic (controller) 910 to decoder 970 and driver 940. Voltage sensing sense amplifiers are coupled to the column decoder via lines 975, and are in turn coupled to buffer circuits 980. Current sources applying the load currents $I_n$ are coupled with the sensing circuits. A program buffer can be included with the sense amplifiers in circuits 980 to store program data for two-level or multiple-level programming of the programmable threshold transistors in the cells. Also, the control logic 910 can include circuits for selectively applying program and inhibit voltages to the strings in the memory in response to the program data values in the program buffer.

Sensed data from the sense amplifiers are supplied via second data lines 985 to data buffer 990, which is in turn coupled to input/output circuits 991 via a data path 993. The sense amplifiers can comprise operational amplifiers configured to apply unity gain or a desired gain level, and provide analog outputs to digital-to-analog converters or other signal processing or signal routing circuits. Additional arithmetic units and routing circuits can be included to provide for arrangement of multiple layers of strings of cells into neuromorphic circuits.

Also, arithmetic units and routing circuits can be included to provide for arrangement of the layers of strings into matrix multiplication units.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 23, control logic 910, using a bias arrangement state machine, controls the application of supply voltages generated or provided through the voltage supply or supplies in block 920, for sum-of-products read operations, and parameter writing operations to set parameters, such as cell weights, represented by charge trapping levels including, for charge trapping cells and floating gate cells, erase, verify and program bias voltages. The control logic 910 is coupled to the buffer 990 and the memory array 960.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Figure 24:
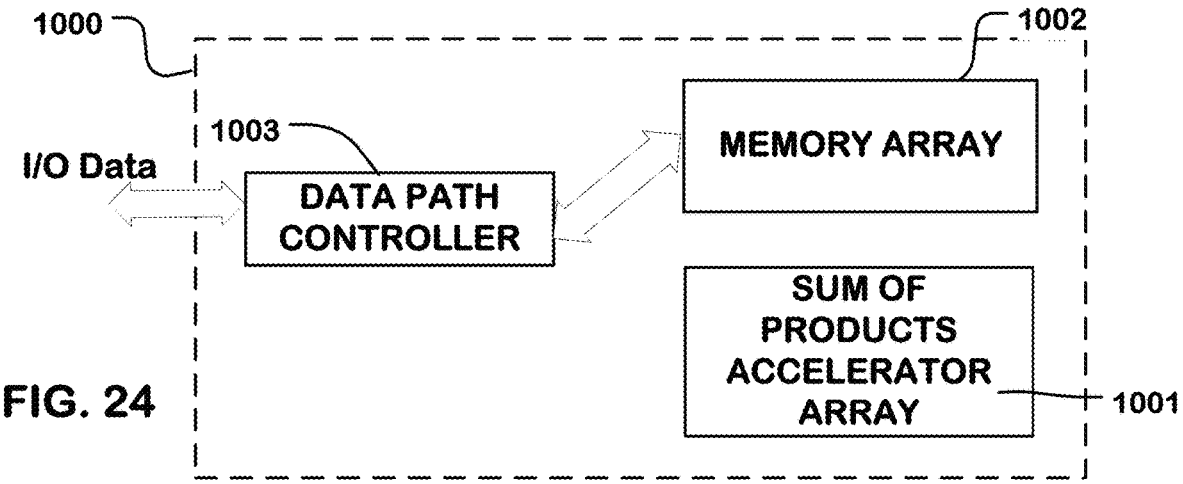
FIGS. 24-26 illustrates a system including a sum-of-products accelerator array, and various operations thereof.
Figure 25:
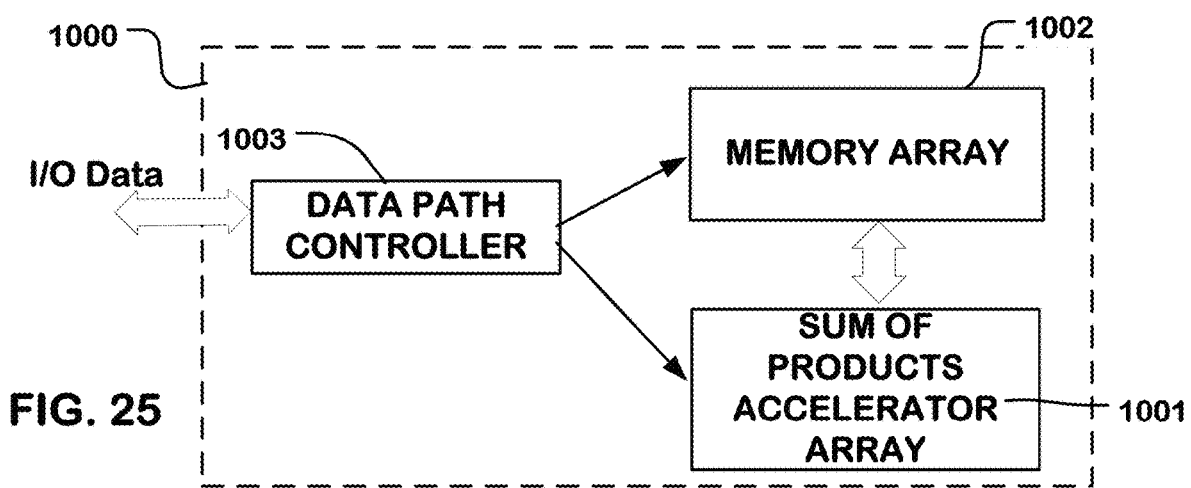
Figure 26:
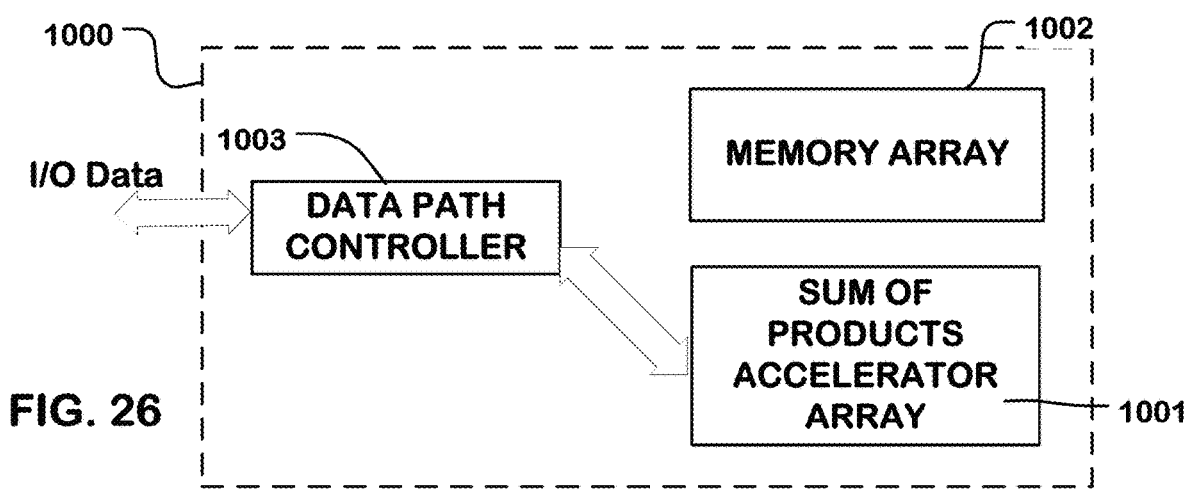

FIGS. 24-26 illustrates a configuration of system 1000 including a memory array 1002 and a sum-of-products accelerator array 1001 interconnected using a data path controller 1003. The sum-of-products accelerator array 1001 comprises an array of programmable resistance cells according to any of the embodiments described above. The memory array can comprise a NAND flash array, an SRAM array, a DRAM array, a NOR flash array, or other type of memory that can be used in coordination with the sum-of-products accelerator array 1001.

The system can receive input/output data from outside the system as shown in FIG. 24, and route the data to the memory array. The data can include configuration data used to configure the functional sets of cells that implement the terms of one or more sum-of-products operations, weights for the functional sets in the array used for the operations, and input values for the sum-of-products operations.

As represented in FIG. 25, data from the memory array 1002 can be transferred to the sum-of-products accelerator array 1001, using a direct data path that can be controlled using the data path controller 1003. Alternatively, a data path through the data path controller 1003 can be used to transfer data from the memory array 1002 to the sum-of-products accelerator array 1001, as suits a particular implementation.

As represented in FIG. 26, output data from the sum-of-products accelerator array can be applied through the data path controller 1003 to the input output data paths for the system 1000. The input output data paths for the system 1000 can be coupled to a processing unit configured to compute weights, provide inputs and utilize the outputs of the sum-of-products accelerator array.

Also, the output data from the sum-of-products accelerator array 1001 can be routed through the data path controller 1003 back to the memory array 1002 for use in iterative sum-of-products operations.

The system 1000 including the memory, the sum-of-products accelerator array and the data path logic can be implemented on a single integrated circuit in some embodiments. Also, the system 1000 can include on the same or different integrated circuits, arithmetic logic units, digital signal processors, general-purpose CPUs, state machines and the like that are configured to take advantage of the sum-of-products accelerator array 1001 during execution of computer processes.

A method for using an array of programmable resistance cells according to any of the embodiments described herein can be executed using a system like that of FIGS. 24-26, using logic implemented on the same integrated circuit, coupled to the integrated circuit, or a combination of both which performs a configuration step in which the functional sets of cells in the array are programmed with respective weights, and an operating step, and which the array is used to produce the sum of products data.

A method for operating an array of variable resistance cells to produce sum of products data comprises programming the programmable threshold transistors in the array with thresholds corresponding to values of a weight factor for the corresponding cell; selectively applying inputs to rows of cells in the array applying currents to corresponding ones of the columns of cells in the array; and sensing voltages on one or more of the columns of cells in the array.

Such a method can include configuring cells in the array into functional sets of cells including one or more members; where the functional set implementing respective terms of a sum of products function. Each functional set can receive a corresponding input term and can be programmed with a weight that is a function of the programmable thresholds of the one or more members of the functional set. The functional set can be configured in a variety of ways, such as described above with reference to FIGS. 18-22. In this way, programmable resistance cells in the array which are operated with weights configured using a one bit binary mode as individual cells, can be configured into functional sets that have multibit weights. The multibit weights can be configured using functional sets of cells that have respective resistors with different resistances, using different current levels during sensing on different columns in the functional set, using arithmetic logic to combine voltages sensed on respective columns in the functional set with different weights, and otherwise as described herein.

Also, in some embodiments, the system can be operated to use a reference column of cells to generate a column reference voltage, or a low column reference voltage and a high column reference voltage as suits a particular implementation. The method can include generating sensing reference voltages as a function of the one or more column reference voltages. The sensing operation can include comparing voltages on selected columns of cells with the sensing reference voltages to generate outputs indicating voltage levels on the selected columns.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising a plurality of levels of word lines overlying a substrate, a plurality of vertical channel structures orthogonal to the substrate, extending through the plurality of levels of word lines, an array of variable resistance cells disposed at cross points of word lines in the plurality of levels of word lines and vertical channel structures in the plurality of vertical channel structures, the array of variable resistance cells being arranged in a plurality of vertical serially-connected strings of variable resistance cells along vertical channel structures in the plurality of vertical channel structures, at least some of the variable resistance cells in the array each comprising a programmable threshold transistor and a resistor connected in parallel; and circuitry to apply current to a selected vertical channel structure in the plurality of vertical channel structures, and input voltages representing values $X_1$ to $X_m$ of an input vector, where m is at least 3, in parallel to word lines $WL_1$ to $WL_m$ in the plurality of levels of word lines, and sense amplifier circuits configured for connection to the selected vertical channel structure in the plurality of vertical channel structures, which are responsive to voltage generated by the current and to a sum of variable resistances of a vertical serially-connected string of variable resistance cells along the selected vertical channel structure generated by the input voltages representing values $X_1$ to $X_m$ and weights stored in the variable resistance cells to produce sum-of-products results for the selected vertical channel structure.

2. The device of claim 1, including word line drivers connected to the word lines in the plurality of levels of word lines to apply variable gate voltages as the input voltages representing values $X_1$ to $X_m$ to the programmable threshold transistors in the variable resistance cells.

3. The device of claim 1, wherein the programmable threshold transistor in the variable resistance cell is a charge trapping memory transistor.

4. The device of claim 3, wherein the resistor in the variable resistance cell is a buried implant resistor in the charge trapping memory transistor.

5. The device of claim 1, wherein the programmable threshold transistor in the variable resistance cell is a floating gate charge trapping memory transistor, and the resistor in the variable resistance cell is a buried implant resistor in the floating gate charge trapping memory transistor.

6. The device of claim 1, wherein the programmable threshold transistor in the variable resistance cell is a dielectric charge trapping memory transistor, and the resistor in the variable resistance cell is a buried implant resistor in the dielectric charge trapping memory transistor.

7. The device of claim 1, wherein the at least some of the variable resistance cells in the array each consists of one transistor having a layout footprint, and one resistor, in which the resistor is implemented within the layout footprint of the one transistor.

8. A device, comprising:

a plurality of levels of word lines overlying a substrate;

a plurality of vertical strings of variable resistance cells orthogonal to the substrate, extending through the levels of word lines;

variable resistance cells in at least some of the strings in the plurality of vertical strings each having a first current-carrying node in a corresponding vertical channel structure of the plurality of vertical strings, a second current-carrying node in the corresponding vertical channel structure, and a control terminal in a corresponding word line of the plurality of levels of word lines, and comprising a programmable threshold transistor and a resistor connected in parallel to the first and second current-carrying nodes, the programmable threshold transistor having a gate connected to the control terminal; and wherein:

a variable resistance of each of the variable resistance cells in the strings is a function of a voltage applied to the control gate of the cell, a threshold of the programmable threshold transistor, and the resistor; and including circuitry to apply current to a selected vertical string in the plurality of vertical strings, and input voltages representing values $X_1$ to $X_m$ of an input vector, where m is at least 3, in parallel to word lines $WL_1$ to $WL_m$ in the plurality of levels of word lines, and sense amplifier circuits configured for connection to the selected vertical string in the plurality of vertical strings, which are responsive to voltage generated by the current and to a sum of variable resistances of the variable resistance cells along the selected vertical string generated by the input voltages representing values $X_1$ to $X_m$ and weights stored in the variable resistance cells to produce sum-of-products results for the selected vertical string.

9. The device of claim 8, wherein the programmable threshold transistor in each of the variable resistance cells is a charge trapping memory transistor, and the threshold of the transistor is a function of charge trapped in the charge trapping memory transistor.

10. The device of claim 9, wherein the resistor in each of the variable resistance cells is a buried implant resistor in the charge trapping memory transistor.

11. The device of claim 8, including circuitry to program the threshold of the programmable threshold transistor with multiple levels.

12. The device of claim 8, wherein the programmable threshold transistor in the variable resistance cell is a floating gate charge trapping memory transistor, and the resistor in each of the variable resistance cells is a buried implant resistor in the floating gate charge trapping memory transistor, and the threshold of the transistor is a function of charge trapped in the floating gate charge trapping memory transistor.

13. The device of claim 8, wherein the programmable threshold transistor in the variable resistance cell is a dielectric charge trapping memory transistor, and the resistor in each of the variable resistance cells is a buried implant resistor in the dielectric charge trapping memory transistor, and the threshold of the transistor is a function of charge trapped in the dielectric charge trapping memory transistor.

* * * * *